(12) United States Patent
Oikawa

(10) Patent No.: US 11,177,235 B2
(45) Date of Patent: Nov. 16, 2021

(54) SEMICONDUCTOR DEVICE WITH IMPROVED SIGNAL TRANSMISSION CHARACTERISTICS

(71) Applicant: RENESAS ELECTRONICS CORPORATION, Tokyo (JP)

(72) Inventor: Ryuichi Oikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/732,020

(22) Filed: Dec. 31, 2019

(65) Prior Publication Data

US 2020/0235068 A1 Jul. 23, 2020

(30) Foreign Application Priority Data

Jan. 18, 2019 (JP) .............................. JP2019-007125

(51) Int. Cl.
*H01L 23/48* (2006.01)
*H01L 23/552* (2006.01)
*H01L 23/00* (2006.01)

(52) U.S. Cl.
CPC ............ *H01L 24/46* (2013.01); *H01L 23/481* (2013.01); *H01L 23/552* (2013.01); *H01L 24/13* (2013.01)

(58) Field of Classification Search
CPC ................ H01L 23/552; H01L 23/481; H01L 23/49838; H01L 23/49816; H01L 24/46; H01L 23/49822; H01L 23/49827; H01L 24/17; H01L 23/5225; H01L 23/49811; H05K 1/0253; H05K 1/0248
USPC .................................. 257/659, 774; 361/783
See application file for complete search history.

(56) References Cited

U.S. PATENT DOCUMENTS

| 9,560,762 | B2 | 1/2017 | Oikawa | |
|---|---|---|---|---|
| 2010/0187679 | A1* | 7/2010 | Hayashi | H01L 24/11 257/692 |
| 2014/0104802 | A1* | 4/2014 | Oikawa | H05K 1/0248 361/783 |
| 2016/0190049 | A1* | 6/2016 | Kariyazaki | H05K 1/0253 257/774 |

FOREIGN PATENT DOCUMENTS

JP 2014-082298 A 5/2014

* cited by examiner

*Primary Examiner* — Didarul A Mazumder
(74) *Attorney, Agent, or Firm* — McDermott Will & Emery LLP

(57) ABSTRACT

The semiconductor device includes a solder ball connected to a pad, and located below the pad, a first wiring electrically connected to the pad, and located above the pad, and a second wiring electrically connected to the first wiring. At this time, a width of the first wiring is greater than a width of the second wiring. Accordingly, high-frequency noise can be reduced while improving signal transmission characteristics.

15 Claims, 55 Drawing Sheets

SEMICONDUCTOR DEVICE WITH IMPROVED SIGNAL TRANSMISSION CHARACTERISTICS

CROSS-REFERENCE TO RELATED APPLICATIONS

The disclosure of Japanese Patent Application No. 2019-007125 filed on Jan. 18, 2019 including the specification, drawings and abstract is incorporated herein by reference in its entirety.

BACKGROUND

The present invention relates to a semiconductor device, for example, the present invention relates to a technique which can be applied to a semiconductor device including a wire substrate.

Japanese Unexamined Patent Application No. 2014-82298 describes a technique for realizing good signal transmission characteristics over a wide band.

SUMMARY

For example, in a semiconductor device which performs high-speed signal transmission typified by 56 Gbps, improvement of signal transmission characteristics is desired. However, the improvement of the signal transmission characteristics means that not only a signal but also a high-frequency noise (noise having a frequency higher than the Nyquist frequency) is often taken into the semiconductor device. Therefore, a technique capable of reducing high-frequency noise while improving signal transmission characteristics is desired.

Other objects and novel features will become apparent from the description of this specification and the accompanying drawings.

The semiconductor device in one embodiment includes an external connection terminal connected to a pad, and located below the pad, a first wiring electrically connected to the pad, and located above the pad, and a second wiring electrically connected to the first wiring. At this time, a width of the first wiring is greater than a width of the second wiring.

According to one embodiment, high-frequency noise can be reduced while improving signal transmission characteristics.

DETAILED DESCRIPTION

Figure 1:
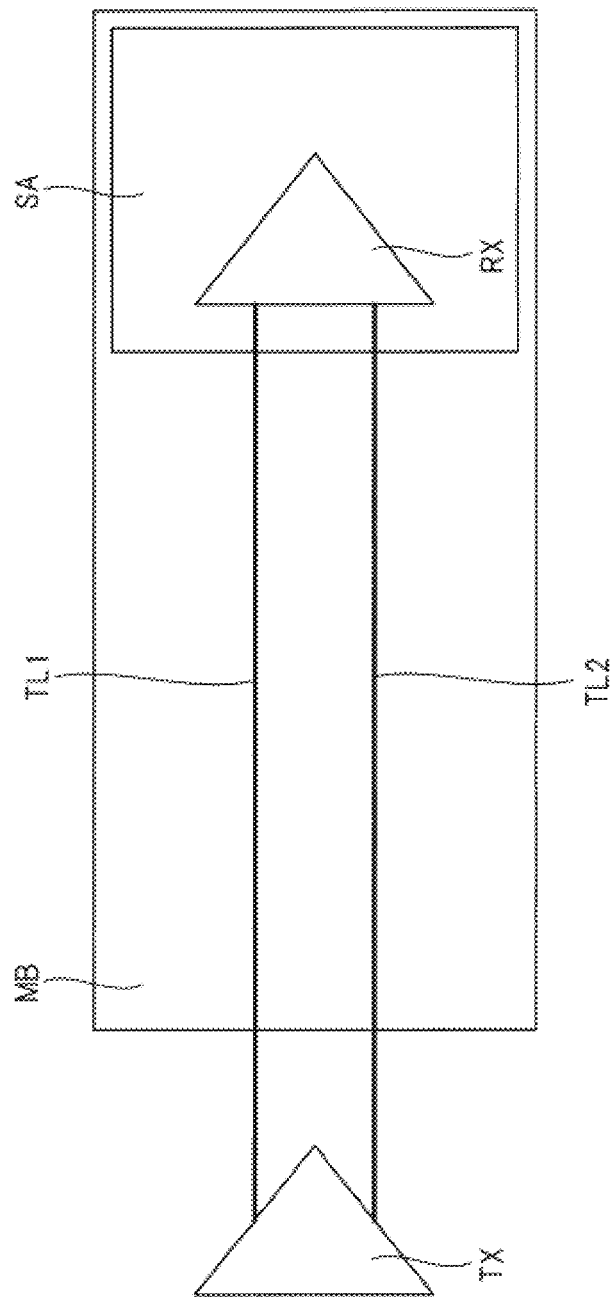
FIG. 1 is a diagram showing a schematic configuration of a transmission system.

In the following embodiments, when required for convenience, the description will be made by dividing into a plurality of sections or embodiments, but except when specifically stated, they are not independent of each other, and one is related to the modified example, detail, supplementary description, or the like of part or all of the other.

In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle.

Furthermore, in the following embodiments, it is needless to say that the constituent elements (including element steps and the like) are not necessarily essential except in the case where they are specifically specified and the case where they are considered to be obviously essential in principle.

Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In all the drawings for explaining the embodiments, the same members are denoted by the same reference numerals in principle, and repetitive descriptions thereof are omitted. Note that even plan view may be hatched for the sake of clarity.

Schematic Configuration of Transmission System

FIG. 1 is a diagram showing a schematic configuration of transmission system.

In FIG. 1, a transmission system is provided with a transmission unit TX for transmitting a signal and a reception unit RX for receiving the signal, and the transmission unit TX and the reception unit RX are connected by a transmission line.

As shown in FIG. 1, the receiving unit RX is incorporated in a semiconductor device SA, and the semiconductor device SA is mounted on a mounting substrate MB, for example. On the other hand, the transmitting unit TX is incorporated in an external device provided outside the mounting substrate MB, for example.

The transmitting unit TX and the receiving unit RX are electrically connected to each other by, for example, differential wirings composed of a transmission line TL1 and a transmission line TL2.

Structure of Semiconductor Device

Figure 2:
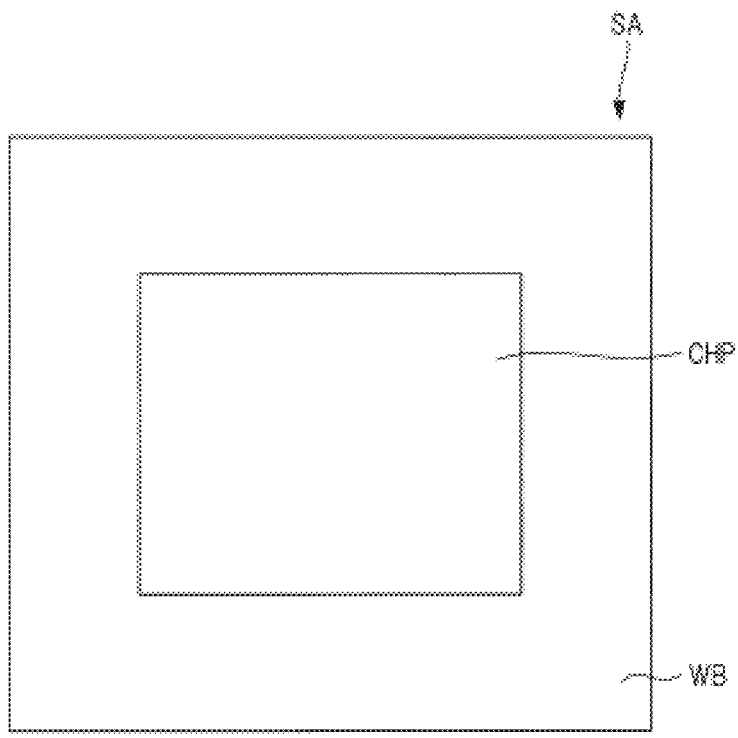
FIG. 2 is a plan view showing a schematic configuration of a semiconductor device.

FIG. 2 is a plan view showing a schematic configuration of the semiconductor device.

In FIG. 2, the semiconductor device SA has, for example, a wiring substrate WB having a rectangular planar shape, and the semiconductor chip CHP is mounted on the wiring substrate WB. In the semiconductor chip CHP, an integrated circuit constituting a receiving section is formed. The receiving section formed in the semiconductor chip CHP is electrically connected to the transmission line formed in the wiring substrate WB.

Figure 3:
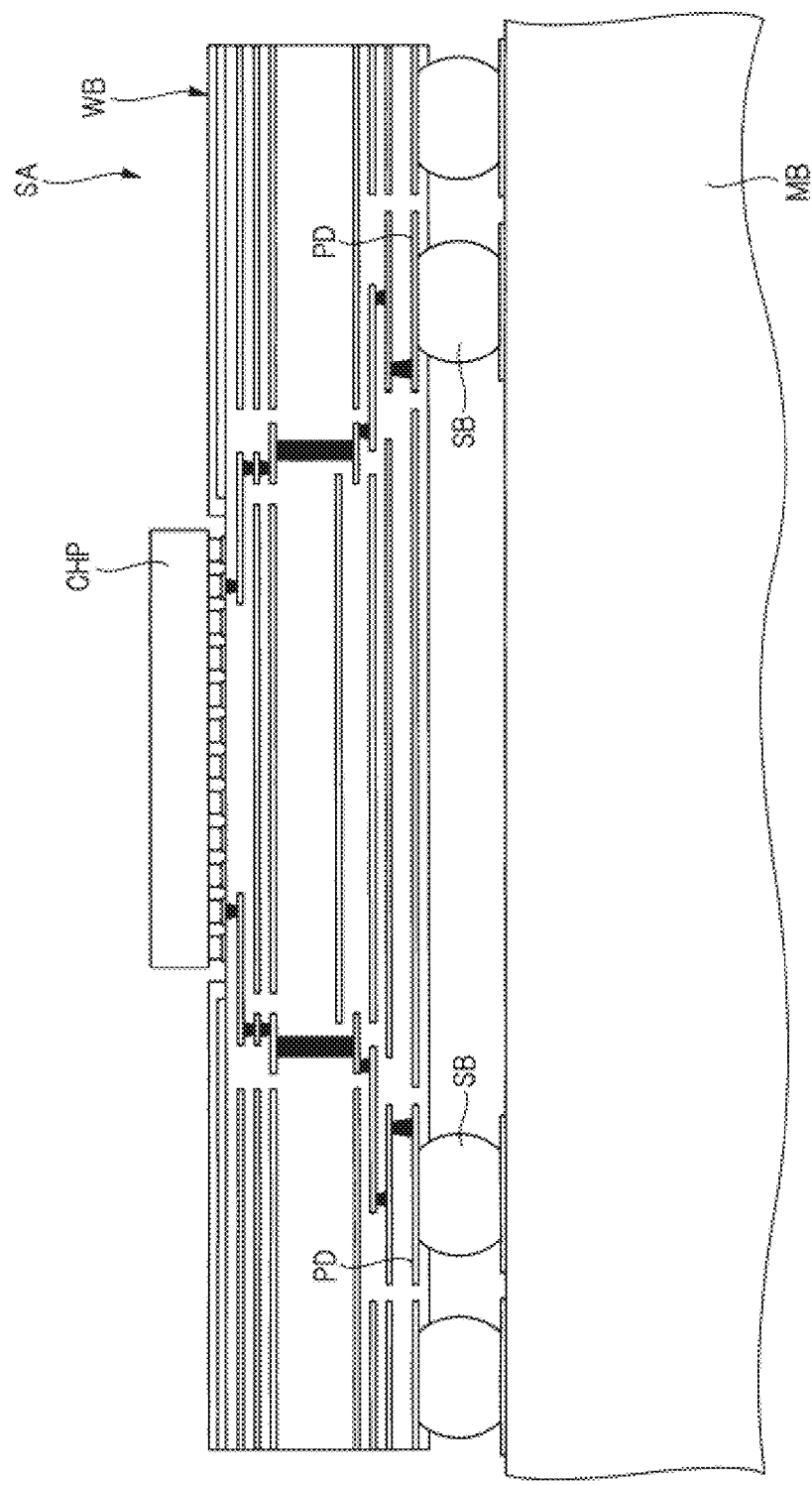
FIG. 3 is a cross-sectional view schematically showing a cross section of a semiconductor device.

FIG. 3 is a cross-sectional view schematically showing a cross section of a semiconductor device;

In FIG. 3, the semiconductor device SA is mounted on the mounting substrate MB. The semiconductor device SA has a wiring substrate WB and a semiconductor chip CHP flip-chip connected to the surface of the wiring substrate WB. And, the semiconductor chip CHP is electrically connected to a multi-layer wiring formed inside the wiring substrate WB. The multi-layer wiring formed inside the wiring substrate WB is electrically connected to a pad PD formed on the back surface of the wiring substrate WB. And, the pad PD is electrically connected to a solder ball (external connection terminal) SB mounted on the pad PD. The wiring substrate WB comprising the semiconductor device SA is connected with the wiring (transmission line) formed in the mounting substrate MB by way of the solder ball SB. In the semiconductor device SA configured as described above, signals propagating through the wiring (transmission line) formed on the mounting substrate MB are transmitted through the multi-layer wiring formed inside the wiring substrate WB via the pads PD mounting the solder balls SB, and then received by the receiving unit of the semiconductor chip CHP flip-chip connected to the wiring substrate WB.

Figure 4:
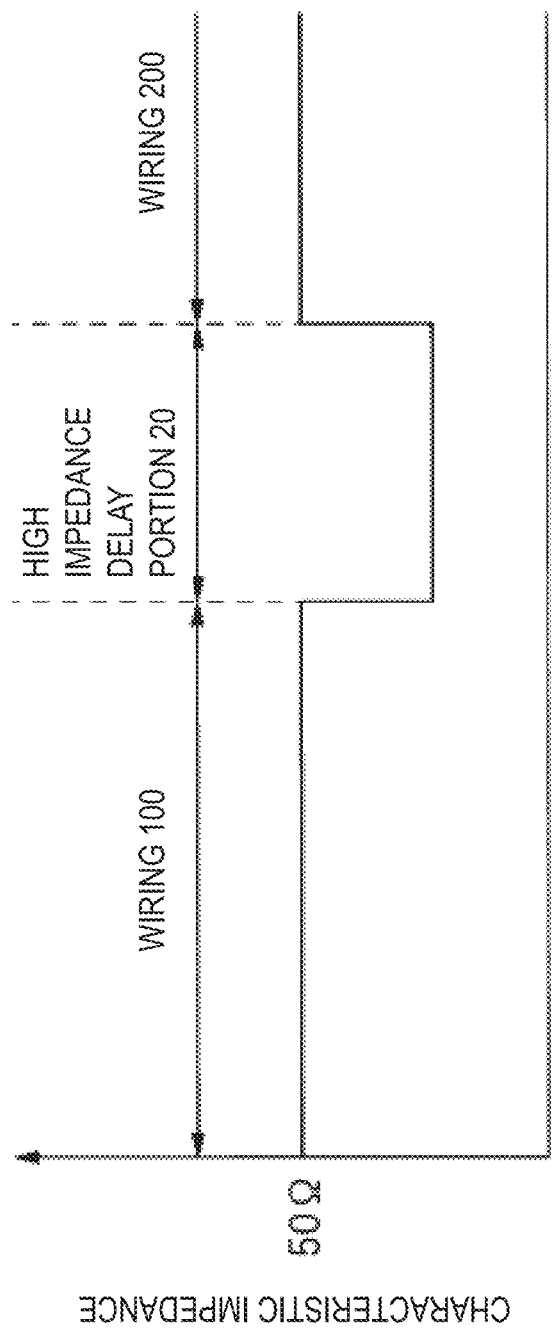
FIG. 4 is a diagram schematically showing a characteristic impedance at the connecting portion between the semiconductor device and the mounting substrate.

FIG. 4 is a diagram schematically showing a characteristic impedance at the connecting portion between the semiconductor device and the mounting substrate. In FIG. 4, the characteristic impedance of the wiring 100 formed in the wiring substrate is 50Ω. Similarly, the characteristic impedance of the wires 200 formed in the mounting substrate is also 50Ω. Here, the wiring substrate and the mounting substrate are connected by a solder ball mounted on a pad, and a connecting portion including the pad and the solder ball becomes a low impedance delay portion 10 having a characteristic impedance smaller than 50Ω. This is because, for example, if the resistor is negligible and the inductance is "L" and the capacitance is "C", the characteristic impedance of the transmission line is expressed by $\sqrt{(L/C)}$. That is, the area of the connection portion including the pad and the solder ball is larger than that of the wiring 100 of the wiring substrate constituting the transmission line or the wiring 200 of the mounting substrate, and the fact that the area is larger means that the capacitance "C" is larger, and as a result, the characteristic impedance of the connection portion including the pad and the solder ball is smaller than 50Ω. Therefore, the connection portion including the pad and the solder ball constitutes the low impedance delay portion 10.

As a result, as shown in FIG. 4, a characteristic impedance mismatch occurs between the wiring 100 and the low impedance delay portion 10 and between the low impedance delay portion 10 and the wiring 200. At the boundary where the characteristic impedance mismatch occurs, the reflection loss of the signal becomes large. As a result, the signal transmission performance is deteriorated.

Figure 5:
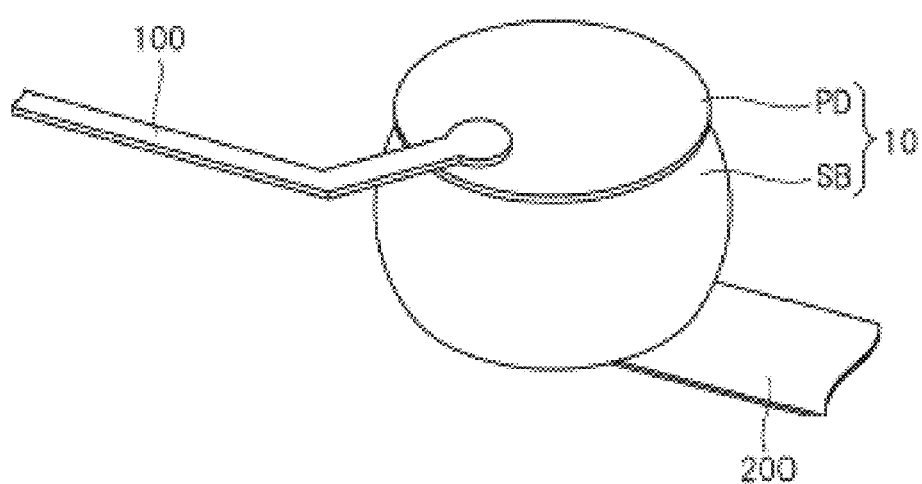
FIG. 5 is a schematic diagram showing the configuration of a specific low impedance delay portion.

FIG. 5 is a schematic diagram showing a specific configuration of the low impedance delay portion 10.

In FIG. 5, the low impedance delay portion 10 includes a pad PD and a solder ball SB. At this time, the wiring 100 formed in the wiring substrate is electrically connected to the pad PD, and the wiring 200 formed in the mounting substrate is electrically connected to the solder ball SB. As shown in FIG. 5, since the effective width of the pad PD and the solder ball SB is larger than, for example, the width of the wiring 100 constituting the transmission line having the characteristic impedance of 50Ω, it is understood that the connection portion including the pad PD and the solder ball SB becomes the low impedance delay portion 10 having the characteristic impedance smaller than 50Ω.

Therefore, in order to reduce the reflection loss of the signal caused by the mismatch of the characteristic impedance between the transmission line and the low impedance delay portion 10, there is a first related technique described below.

Description of First Related Art

The "related art" referred to in the present specification is a technology having a problem newly found by the inventor, and is not a known prior art, but is a technology described with the intention of a prerequisite technology (unknown technology) of a new technical idea, although it is not a known prior art.

Figure 6:
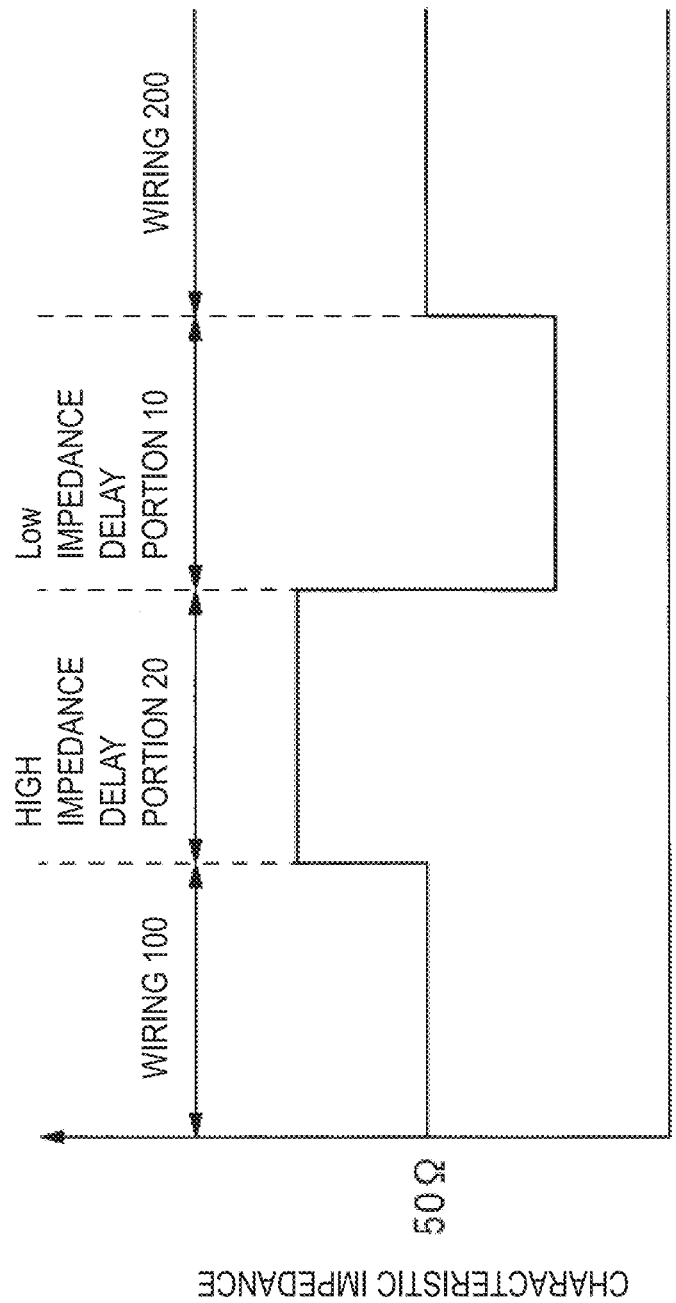
FIG. 6 is a diagram schematically showing a characteristic impedance at the connecting portion between the semiconductor device and the mounting substrate in the first related art.

FIG. 6 is a diagram schematically showing a characteristic impedance at the connecting portion between the semiconductor device and the mounting substrate in the first related art. In the first related art shown in FIG. 6, a high impedance delay portion 20 having a characteristic impedance larger than 50Ω is provided between the wiring 100 and the low impedance delay portion 10. At this time, in the first related art, the characteristic impedance of the high impedance delay portion 20 is adjusted so that the characteristic impedance becomes 50Ω by combining the high impedance delay portion 20 and the low impedance delay portion 10. As a result, for example, the combination of the low-impedance delay unit 10 and the high-impedance delay unit 20 appears to be equivalent to the combination of the 50Ω transmission line for the signal propagating through the wire 200 of the mounting substrate, and the combination of the low-impedance delay unit 10 and the high-impedance delay unit 20 appears to be equivalent to the combination of the 50Ω transmission line for the signal propagating through the wire 200. As a result, signals that have propagated through the wiring 200 of the mounting substrate are smoothly propagated to the wiring 100 of the wiring substrate without substantially causing reflectance losses. That is, in the first related art, the influence of the low impedance delay portion having a small characteristic impedance is offset by the influence of the high impedance delay portion having a large characteristic impedance, thereby reducing the reflection loss caused by the discontinuity of the characteristic impedance.

Figure 7:
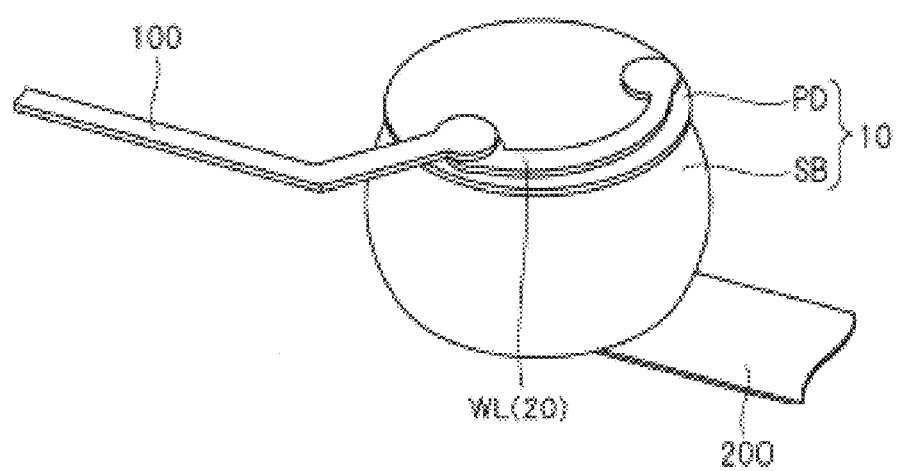
FIG. 7 is a schematic diagram showing a specific configuration of a low impedance delay portion and a high impedance delay portion in the first related art.

FIG. 7 is a schematic diagram showing a specific configuration of a low impedance delay portion and a high impedance delay portion in the first related art.

In FIG. 7, the low impedance delay portion 10 is configured to include a pad PD and a solder ball SB, while the high impedance delay portion 20 is configured to include a wiring WL. As described above, the high impedance delay portion 20 having the characteristic impedance larger than 50Ω is realized by using the parasitic inductance due to the wiring WL.

In the first related art, the reflection loss of the signal can be reduced by providing the high impedance delay portion 20 that cancels the influence of the low impedance delay portion 10.

However, when the frequency of the propagating signal increases, the measures in the first related art described above become insufficient. This point will be described below.

Figure 8:
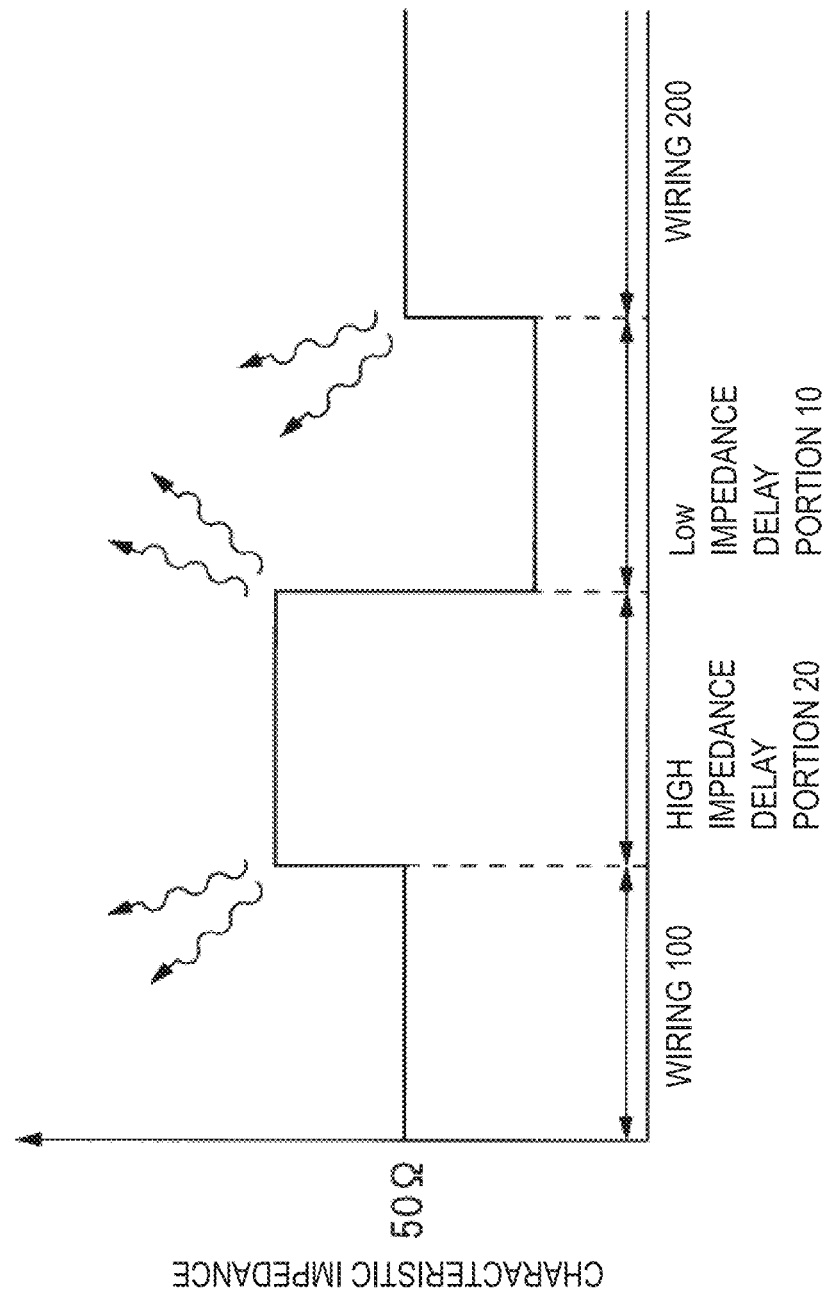
FIG. 8 is a diagram for explaining that reflection loss increases in a high-frequency signal.

FIG. 8 is a diagram for explaining that reflection loss increases in a high-frequency signal.

In FIG. 8, when the frequency of the signal is low, for example, the combination of the low impedance delay portion 10 and the high impedance delay portion 20 appears to be equivalent to the combination of the 50Ω transmission line for the signal propagating through the wire 200 of the mounting substrate. On the other hand, when the frequency of the signal becomes higher, the low impedance delay portion 10 and the high impedance delay portion 20 appear to be separate from each other, not the mean of the low impedance delay portion 10 and the high impedance delay portion 20, for the signal propagating through the wire 200 of the mounting substrate. This means that the discontinuous region of the characteristic impedance appears to be increased for the high-frequency signal. That is, when the above-described first related technique is applied to a high-frequency signal, for example, as shown in FIG. 8, it appears that a discontinuous region of characteristic impedance exists at the boundary between the wiring 200 and the low-impedance delay unit 10, the boundary between the low-impedance delay unit 10 and the high-impedance delay unit 20, and the boundary between the high-impedance delay unit 20 and the wiring 100.

As a result, as shown in FIG. 8, in the first related art, the reflection loss with respect to the high-frequency signal becomes large. In this regard, in order to reduce reflection loss with respect to a high-frequency signal, there is a second related art described below.

Description of Second Related Art

Figure 9:
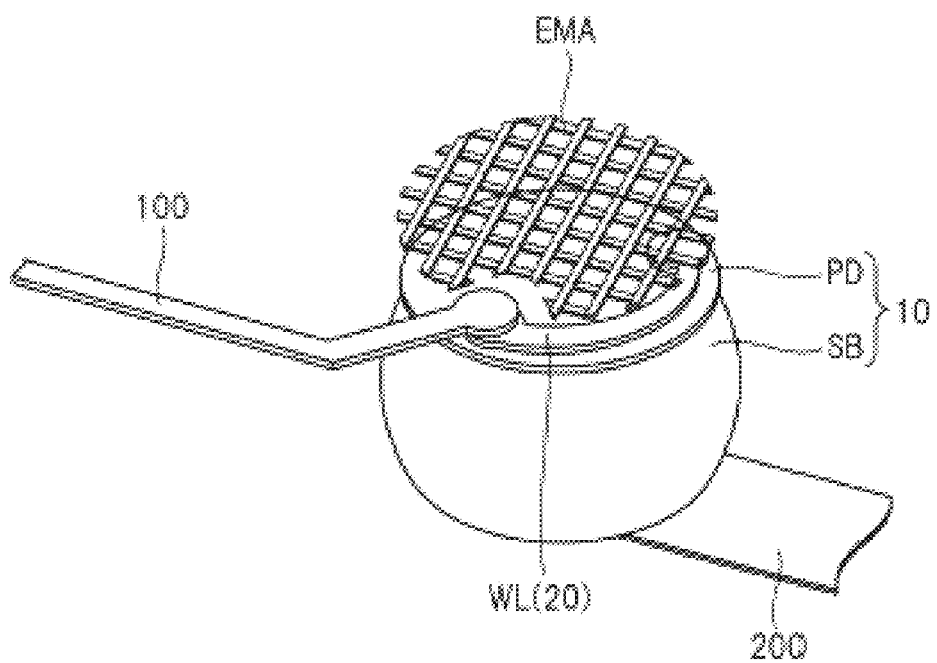
FIG. 9 is a diagram illustrating a second related technique.

FIG. 9 is a diagram for explaining the second related art. In FIG. 9, the low impedance delay portion 10 is configured to include a pad PD and a solder ball SB, while the high impedance delay portion 20 is configured to include a wiring WL. This configuration is the same as that of the first related art shown in FIG. 7. Further, in the second related art, as shown in FIG. 9, an electromagnetic wave absorber EMA is provided above the pad PD. As a result, according to the second related art, even in the high-frequency signal, a part of the electromagnetic wave scattered in the discontinuous region of the characteristic impedance is absorbed. As a result, according to the second related art, the reflection loss for the high-frequency signal can be reduced.

Consideration of Improvement to Second Related Art

However, the inventors of the present invention have investigated and newly found that in the second related art, since the discontinuity in the discontinuous region of the characteristic impedance is too large, too many electromagnetic waves are scattered in the discontinuous region of the characteristic impedance, and the electromagnetic wave absorber EMA cannot completely absorb the electromagnetic waves. That is, in the second related art, there is room for improvement from the viewpoint of sufficiently reducing the reflection loss with respect to the high-frequency signal. In particular, the signal transmission characteristics are deteriorated with respect to a high-frequency signal having a frequency of 25 GHz or more. Therefore, the second related art is insufficient from the viewpoint of ensuring signal transmission characteristics with respect to a high-frequency signal used for signal transmission of, for example, 56 Gbps or more. Therefore, the present inventor has devised a room for improvement existing in the second related art. Draft measures of the first embodiment to which the present invention is applied will be described.

Proposed Measures

Figure 10:
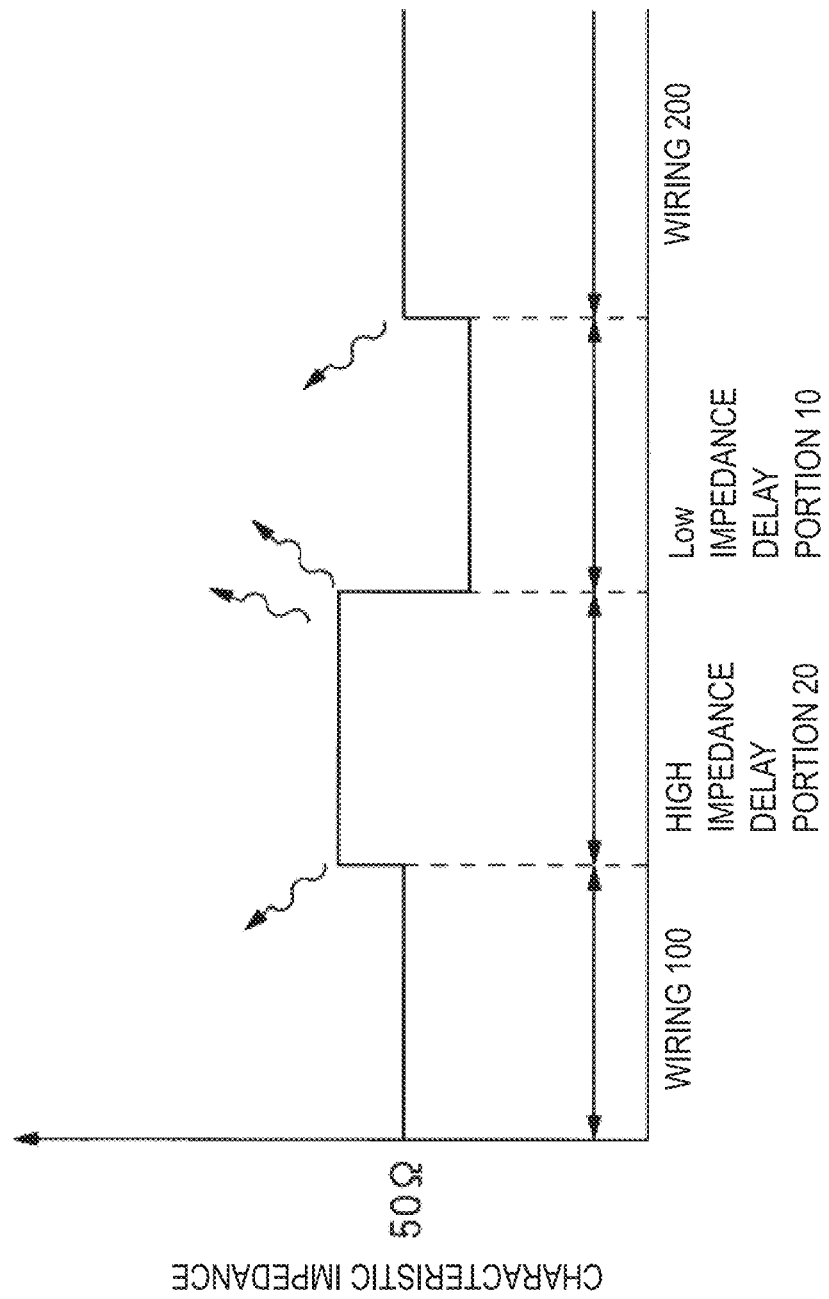
FIG. 10 is a diagram schematically showing a characteristic impedance at the connecting portion between the semiconductor device and the mounting substrate in the countermeasure proposal.

FIG. 10 is a diagram schematically showing a characteristic impedance at the connecting portion between the semiconductor device and the mounting substrate in the countermeasure proposal. In the measure plan shown in FIG. 10, the discontinuity of the characteristic impedance in the low impedance delay portion 10 and the discontinuity of the characteristic impedance in the high impedance delay portion 20 are reduced. In this case, considering that the smaller the discontinuity of the characteristic impedance, the smaller the scattering of the high-frequency signal (electromagnetic wave) in the discontinuous region of the characteristic impedance, the countermeasure shown in FIG. 10 reduces the scattering of the electromagnetic wave in the discontinuous region of the characteristic impedance as compared with the second related art shown in FIG. 8. As a result, in the countermeasure proposal, the electromagnetic wave absorber can sufficiently absorb the electromagnetic wave scattered in the discontinuous region of the characteristic impedance by providing the electromagnetic wave absorber. This means that the reflection loss for the high-frequency signal can be sufficiently reduced according to the countermeasure proposal. As a result, according to the countermeasure proposal, it is possible to reduce a transmission loss (insertion loss) in a high-frequency signal.

Figure 11:
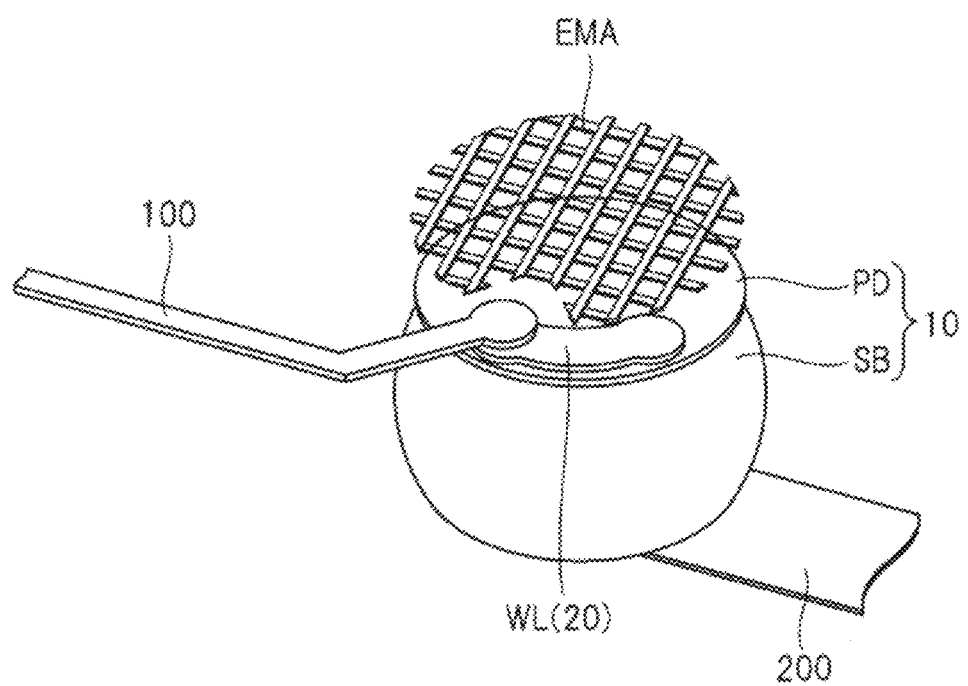
FIG. 11 is a diagram for explaining a specific configuration of the countermeasure proposal.

FIG. 11 is a diagram for explaining a specific configuration of the countermeasure proposal.

In FIG. 11, in the countermeasure plan, the length of the wiring WL constituting the high impedance delay portion 20 is short and thick. Thus, the parasitic inductance of the wiring WL can be reduced. Therefore, as shown in FIG. 10, the discontinuity of the high impedance delay portion 20 formed of the wiring WL is alleviated. On the other hand, in FIG. 11, in the countermeasure plan, the size of the pad PD and the size of the solder ball included in the low impedance delay portion 10 are reduced. As a result, the parasitic capacitance of the low impedance delay portion 10 can be reduced. Therefore, as shown in FIG. 10, the discontinuity of the low impedance delay portion 10 including the pad PD and the solder ball SB is alleviated.

As described above, in the countermeasure plan, the deviation (discontinuity) of the characteristic impedance in the low impedance delay portion 10 from 50Ω and the deviation (discontinuity) of the characteristic impedance in the high impedance delay portion 20 from 50Ω can be reduced. Thereby, according to the countermeasure proposal including the electromagnetic wave absorber EMA, the electromagnetic wave scattered in the discontinuous region of the characteristic impedance can be sufficiently absorbed by the electromagnetic wave absorber EMA, and consequently, according to the countermeasure proposal, the reflection loss with respect to the high-frequency signal can be sufficiently reduced. Therefore, according to the countermeasure proposal, it is possible to reduce the transmission loss (insertion loss) in the high-frequency signal.

Knowledge Found by Inventor

As described above, the countermeasure proposal is useful in that the transmission loss in the high-frequency signal can also be reduced, so that the signal transmission band can be improved. However, the fact that the signal transmission band can be improved means that high-frequency noise can also pass through well. That is, in the countermeasure proposal, the high-frequency signal and the high-frequency noise are passed through well. Therefore, in the countermeasure proposal, while the signal transmission characteristic can be improved, the high-frequency noise is also passed well, so that the deterioration of the high-frequency noise tolerance becomes obvious as a problem. Particularly, in the countermeasure proposal, when a multi-level modulated signal vulnerable to noise is transmitted, the tolerance to high-frequency noise (noise having a frequency component higher than the Nyquist frequency) is deteriorated.

In this regard, high frequency noises are generated by crosstalk, signal reflections, and the like on the mounting substrate and enter the semiconductor device mounted on the mounting substrate. Therefore, when adopting a countermeasure for passing high-frequency noise well together with a high-frequency signal, it is necessary to use a filter for passing the high-frequency signal while removing the high-frequency noise. However, the addition of such a filter increases the system cost. Also, due to the high frequency of the signal (e.g., 56 Gbps) per se, filters that pass high frequency signals while removing high frequency noises are difficult to obtain, fabricate, and even mount on a mounting substrate, regardless of costs.

Therefore, present embodiment has devised the above-mentioned countermeasure proposal. Hereinafter, the technical idea in the present embodiment to which the present invention is applied will be described.

Basic Concept in Present Embodiment

Figure 12:
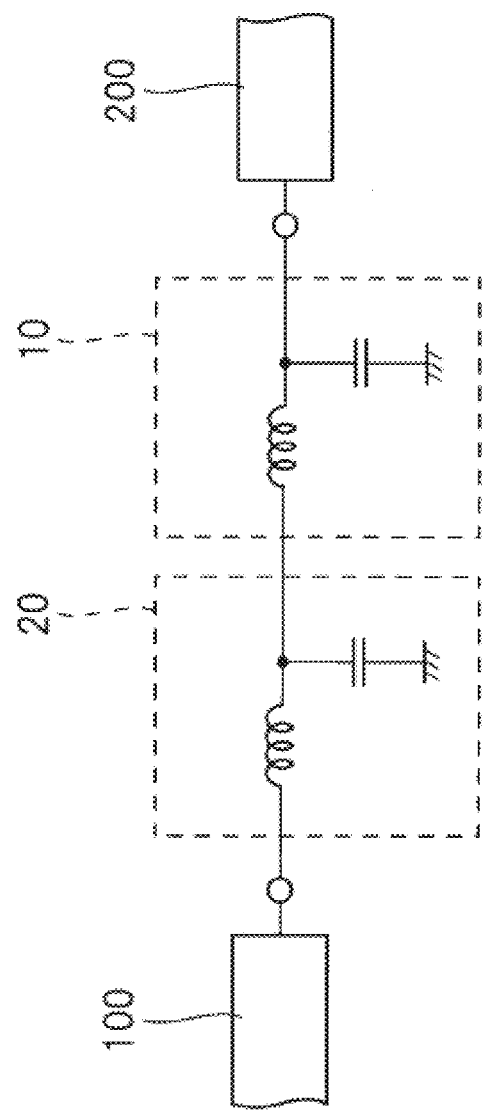
FIG. 12 is an equivalent circuit diagram of a connection portion between a semiconductor device and a mounting substrate.

FIG. 12 is a diagram showing an equivalent circuit diagram of a connection portion between the semiconductor device and the mounting substrate.

In FIG. 12, a wiring 200 is a wiring formed in a mounting substrate. On the other hand, the wiring 100 is a wiring formed in a semiconductor device mounted on a mounting substrate. A connection portion between the semiconductor device and the mounting substrate is provided between the wiring 200 and the wiring 100, and this connection portion is composed of a low impedance delay portion 10 and a high impedance delay portion 20. Each of the low impedance delay portion 10 and the high impedance delay portion 20 is composed of an L/C circuit. The low impedance delay portion 10 and the high impedance delay portion 20 are respectively configured by the value of the inductance and the value of the capacitance of the L/C circuit.

Figure 13:
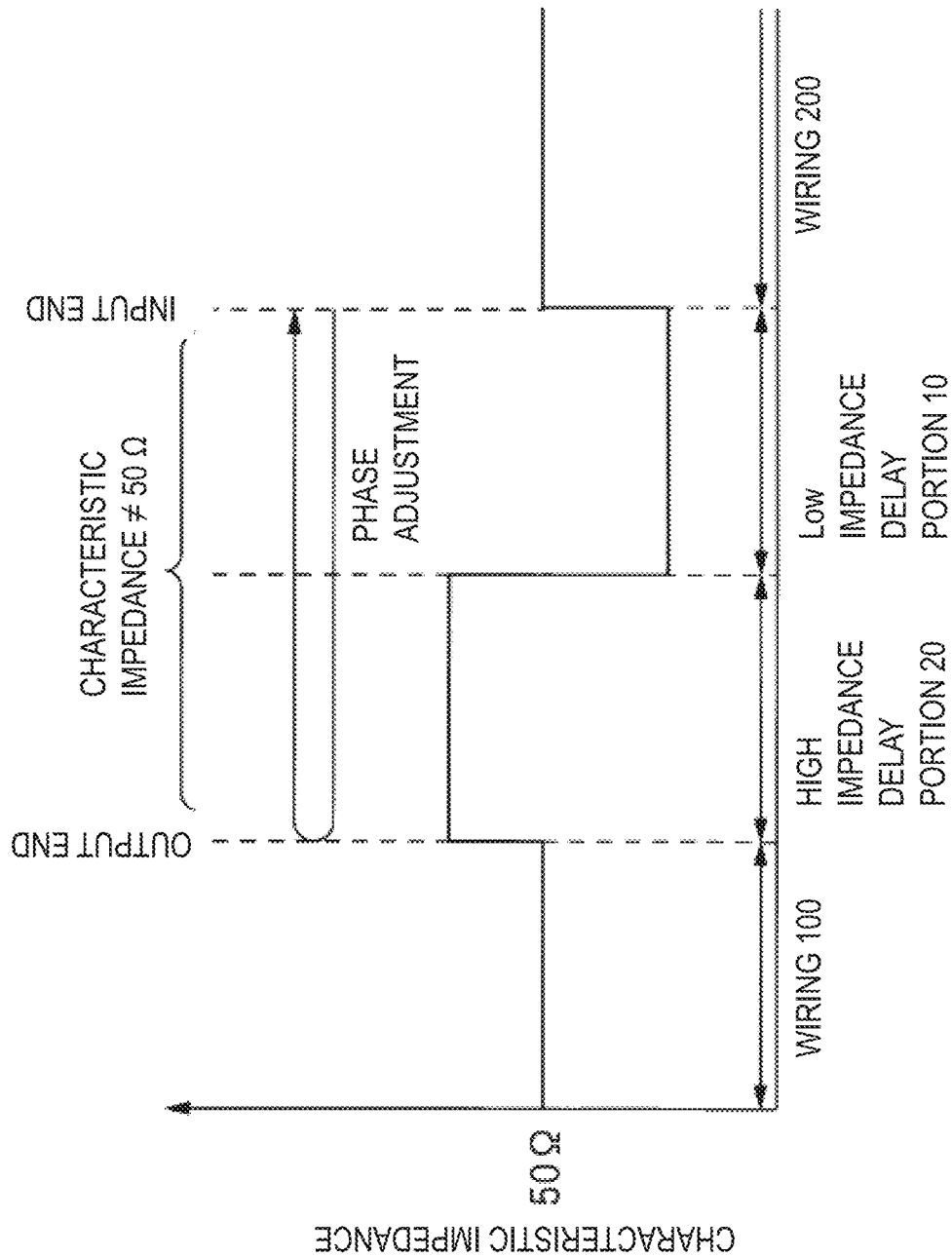
FIG. 13 is a diagram for explaining the basic idea in present embodiment.

FIG. 13 is a diagram for explaining the basic idea in the present embodiment.

FIG. 13 schematically shows a characteristic impedance at the connecting portion between the semiconductor device and the mounting substrate in the present embodiment.

In present embodiment, in particular, it is assumed that high-frequency signals propagate from the wiring 200 formed in the mounting substrate to the wiring 100 formed in the semiconductor device, and as shown in FIG. 13, a boundary region between the wiring 200 and the low-impedance delay portion 10 of the connection portion is used as an input end, and a boundary region between the wiring 100 and the high-impedance delay portion 20 of the connection portion is used as an output end.

At this time, the characteristic impedance of the wiring 200 and the characteristic impedance of the wiring 100 are both 50Ω. On the other hand, the characteristic impedance of the low impedance delay portion 10 is smaller than 50Ω, and the characteristic impedance of the high impedance delay portion 20 is larger than 50Ω.

Therefore, in present embodiment, a discontinuity in the characteristic impedance occurs at the input end, which is the interface between the wire 200 and the low impedance delay portion 10. Similarly, in present embodiment, a discontinuity in the characteristic impedance occurs also in the interface area between the low impedance delay portion 10 and the high impedance delay portion 20. Further, in the present embodiment, a discontinuity in the characteristic impedance also occurs at the output end, which is the interface area between the high impedance delay portion 20 and the wire 100.

Therefore, the high-frequency signal propagating through the wiring 200 is subjected to multiple reflection due to discontinuity of the characteristic impedance existing in the connection portion between the input end and the output end, i.e., the low-impedance delay portion 10 and the high-impedance delay portion 20, thereby causing reflection loss. At this time, the reflection loss of the high-frequency signal can be reduced by performing the phase adjustment between the input end and the output end. Specifically, the phase of the high-frequency signal incident on the input end and the phase of the reflection signal reflected at the output end and returned to the input end again after incident from the input end are adjusted so as to be shifted by 180 degrees, whereby the reflection loss of the high-frequency signal at the input end and the output end can be reduced. This is because the reflection signal returning to the wiring 200 is reduced when the phase of the high-frequency signal incident on the input end and the phase of the reflection signal returning to the input end again after being incident from the input end are shifted by 180 degrees.

Figure 14:
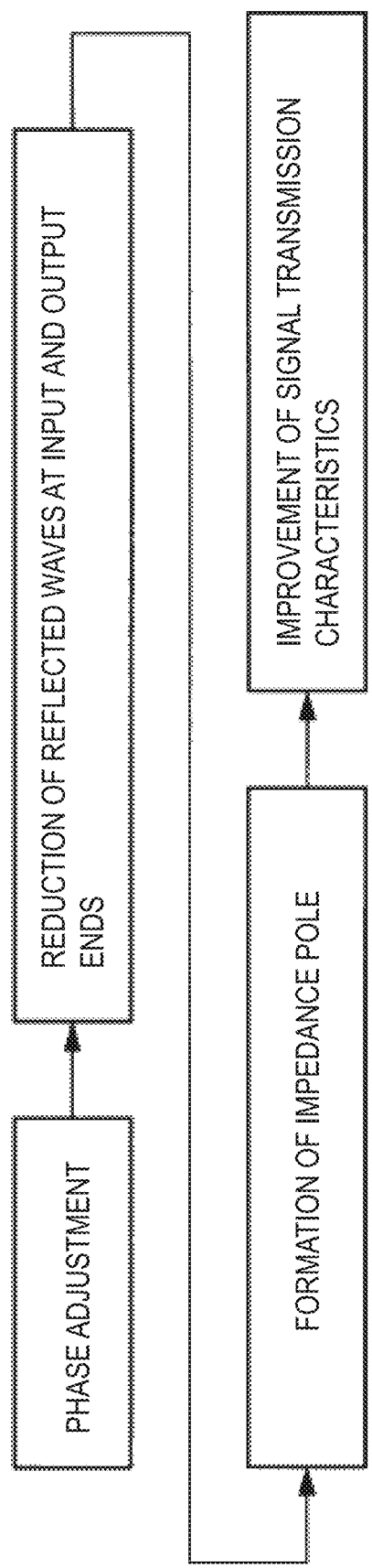
FIG. 14 is a diagram for explaining that the signal transmission characteristic can be improved.

As described above, in the present embodiment, first, the phase of the high-frequency signal incident on the input end and the phase of the reflection signal incident on the input end and then reflected on the output end and returned to the input end are adjusted so as to be 180 degrees. That is, as shown in FIG. 14, when the phase adjustment is performed at the connection portions (the low impedance delay portion 10 and the high impedance delay portion 20), the reflected waves at the input end and the output end are reduced. This means that an impedance pole is formed, whereby the signal transmission characteristics can be improved. This will be explained using FIG. 15.

Figure 15:
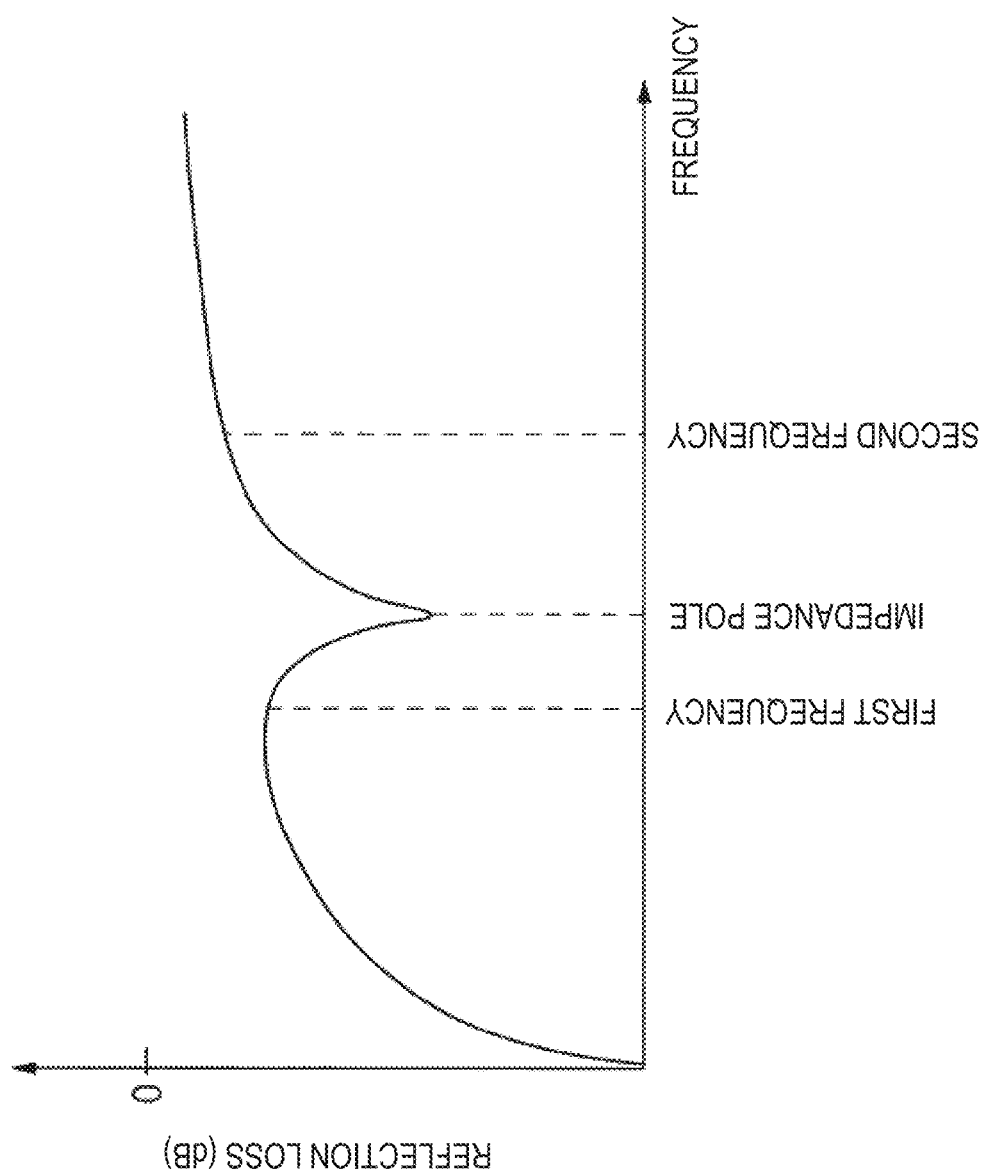
FIG. 15 is a graph showing the relationship between frequency and reflection loss.

FIG. 15 is a graph showing the relationship between frequency and reflection loss.

In FIG. 15, when the phase of the high-frequency signal incident on the input end and the phase of the reflection signal reflected at the output end and returned to the input end again after incident from the input end are adjusted to be 180 degrees, reflection loss is remarkably reduced at the frequency causing the phase shift of 180 degrees, and as a result, an impedance pole is formed. At this time, when the first frequency shown in FIG. 15 is a Nyquist frequency, the reflection loss of the first frequency signal can be reduced by providing an impedance pole. As a result, the transmission loss (insertion loss) of the first frequency signal can be reduced, so that the signal transmission characteristic can be improved.

However, as shown in FIG. 15, when the phase adjustment is performed to form the impedance pole, not only the Nyquist frequency but also the reflection loss of the second frequency signal higher than the Nyquist frequency is reduced. For example, when the second frequency is a frequency of the high-frequency noise, the transmission loss of the high-frequency noise is also reduced when the phase adjustment is performed.

First, in order to reduce transmission losses of the first frequency signal (signal of Nyquist frequency), the present embodiment intentionally shifts the characteristic impedance of the connection portion seen from the input end (or the characteristic impedance of the connection portion seen from the output end) from 50Ω on the assumption that the phase between the input end and the output end is adjusted. Thus, according to the present embodiment, it is possible to reduce the high-frequency noise (noise of the second frequency higher than the Nyquist frequency) while improving the signal transmission characteristics of the first frequency signal (signal of the Nyquist frequency).

Figure 16:
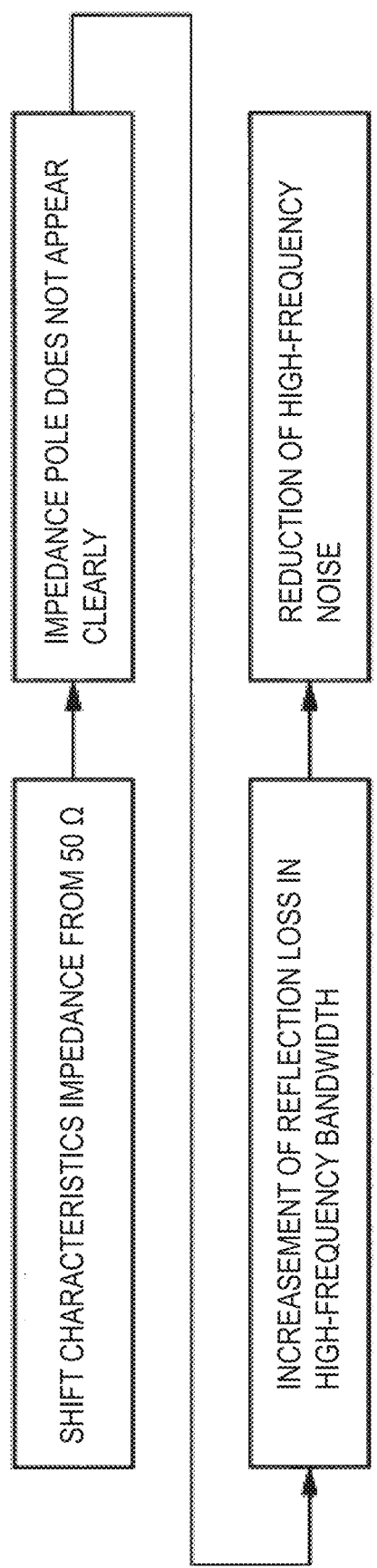
FIG. 16 is a diagram for explaining that high-frequency noise can be reduced.

That is, as shown in FIG. 16, intentionally shifting the characteristic impedance of the connection portion as viewed from the input end (or the characteristic impedance of the connection portion as viewed from the output end) from 50Ω means that the impedance pole does not appear clearly, thereby increasing the reflection loss in the frequency band higher than the impedance pole. As a result, according to the present embodiment, it is possible to realize reduction of high-frequency noises.

This will be explained using FIG. 17.

Figure 17:
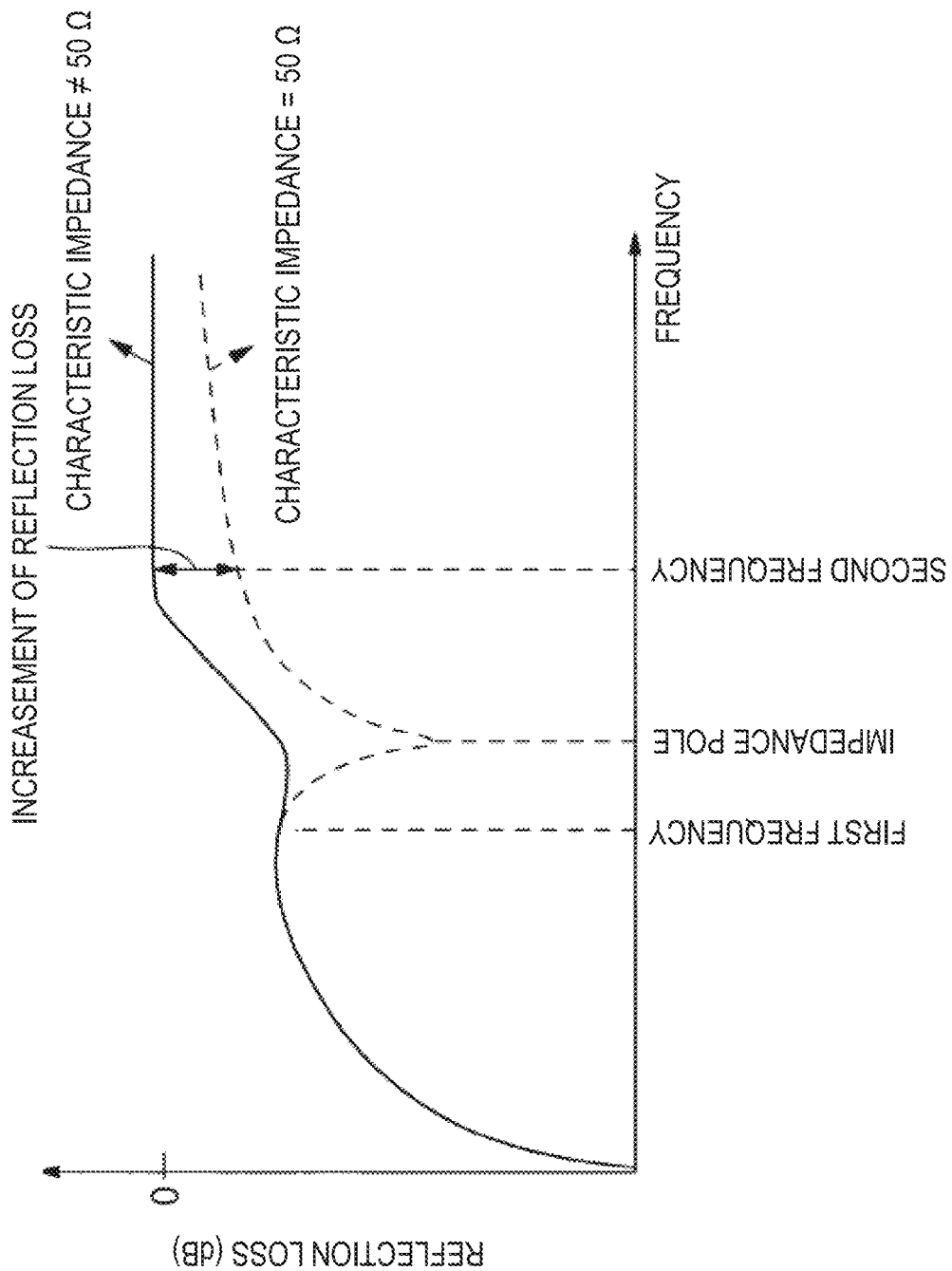
FIG. 17 is a graph showing the relationship between frequency and reflection loss.

FIG. 17 is a graph showing the relationship between frequency and reflection loss.

In FIG. 17, the dotted line is a graph showing the frequency dependence of the reflection loss when the characteristic impedance of the connection portion (the combination of the low impedance delay portion 10 and the high impedance delay portion 20) seen from the input end is 50Ω. As shown by the dotted line in FIG. 17, when the phase adjustment is performed and the characteristic impedance of the connection portion (combination of the low impedance delay portion 10 and the high impedance delay portion 20) seen from the input end is set to 50Ω, the impedance pole clearly appears, and as a result, the reflection loss can be greatly reduced not only at the first frequency but also at the second frequency. This means that not only the signals of the Nyquist frequency but also the transmission losses of the high-frequency noise are reduced, which leads to a good incorporation of the high-frequency noise from the mounting substrate into the semiconductor device, resulting in a deterioration of the high-frequency noise immunity.

On the other hand, in FIG. 17, the solid line is a graph showing the frequency dependence of the reflection loss when the characteristic impedance of the connection portion (the combination of the low impedance delay portion 10 and the high impedance delay portion 20) seen from the input end intentionally deviates from 50Ω. As shown by the solid line in FIG. 17, while the phase adjustment is performed, when the characteristic impedance of the connection portion seen from the input end (the combination of the low impedance delay portion 10 and the high impedance delay portion 20) is intentionally shifted from 50Ω, the impedance pole does not appear clearly. As a result, the reflection loss can be reduced at the first frequency lower than the impedance pole, while the reflection loss can be increased at the second frequency higher than the impedance pole. According to the present embodiment, it is possible to reduce high-frequency noises while improving the signal transmission characteristics of the Nyquist frequency signal.

The basic idea in the present embodiment is a combination of the idea of adjusting the phase of the high-frequency signal incident on the input end and the phase of the reflection signal incident on the input end and reflected on the output end and returning to the input end so as to be 180 degrees, and the idea of intentionally shifting the characteristic impedance of the connecting portion (the combination of the low-impedance delay portion 10 and the high-impedance delay portion 20) seen from the input end from 50Ω.

According to the basic idea of the present embodiment, it is possible to remove high-frequency noises having a higher frequency than the impedance pole while improving the signal transmission characteristics in a frequency band lower than the impedance pole. In other words, the basic idea of the present embodiment is to configure the band-limiting filters by devising a combination of the low-impedance delay unit 10 and the high-impedance delay unit 20.

Figure 18:
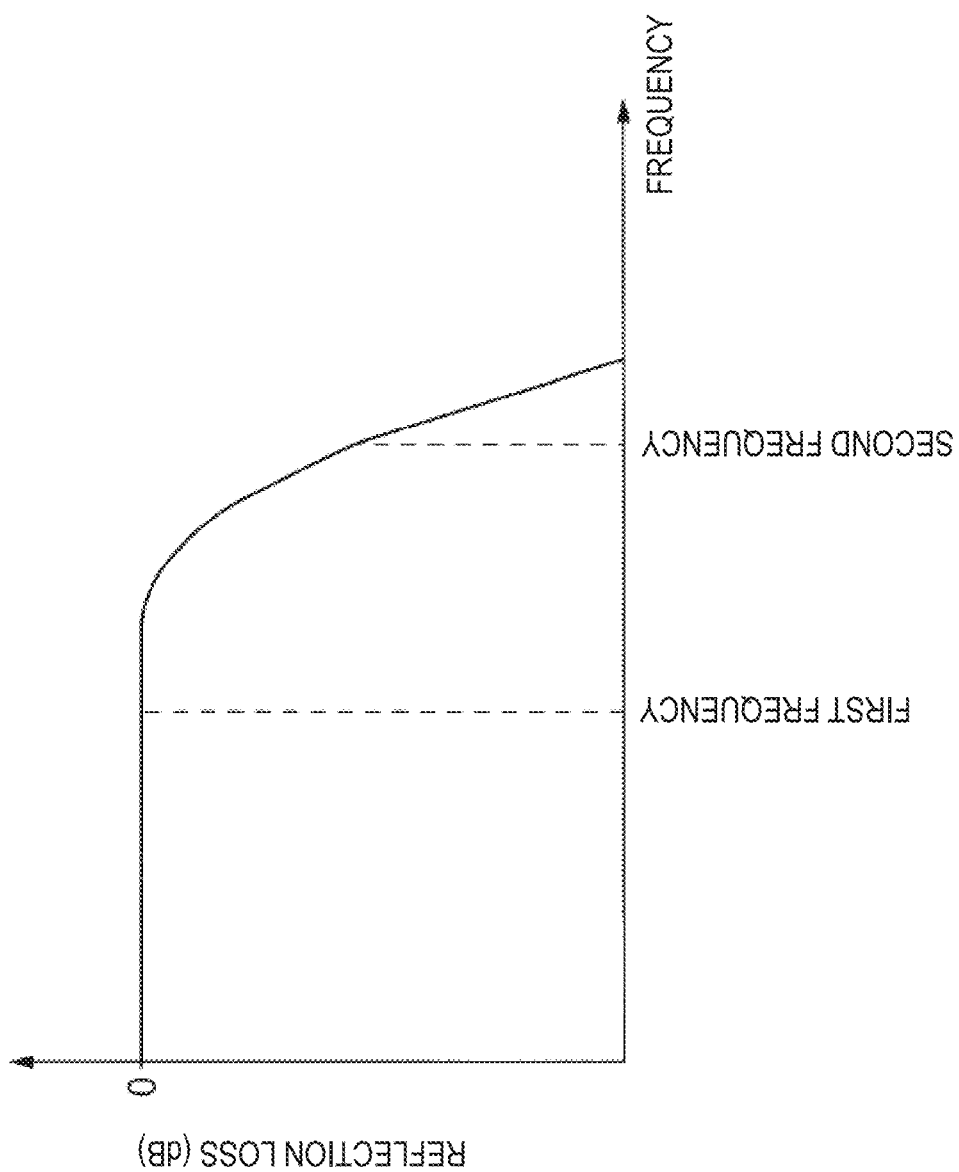
FIG. 18 is a graph schematically showing a band-limiting filter realized by the basic idea in the embodiment.

FIG. 18 is a diagram schematically showing band-limiting filters realized by the basic idea in the present embodiment. As shown in FIG. 18, according to the band-limiting filter realized by the basic idea in the present embodiment, it is possible to increase the transmission loss (insertion loss) of the second frequency (high-frequency noise) while improving the signal transmission characteristics at the first frequency (Nyquist frequency). In other words, according to the band-limiting filter realized by the basic idea in present embodiment, it is possible to reduce high-frequency noises while improving signal transmission characteristics.

Figure 19:
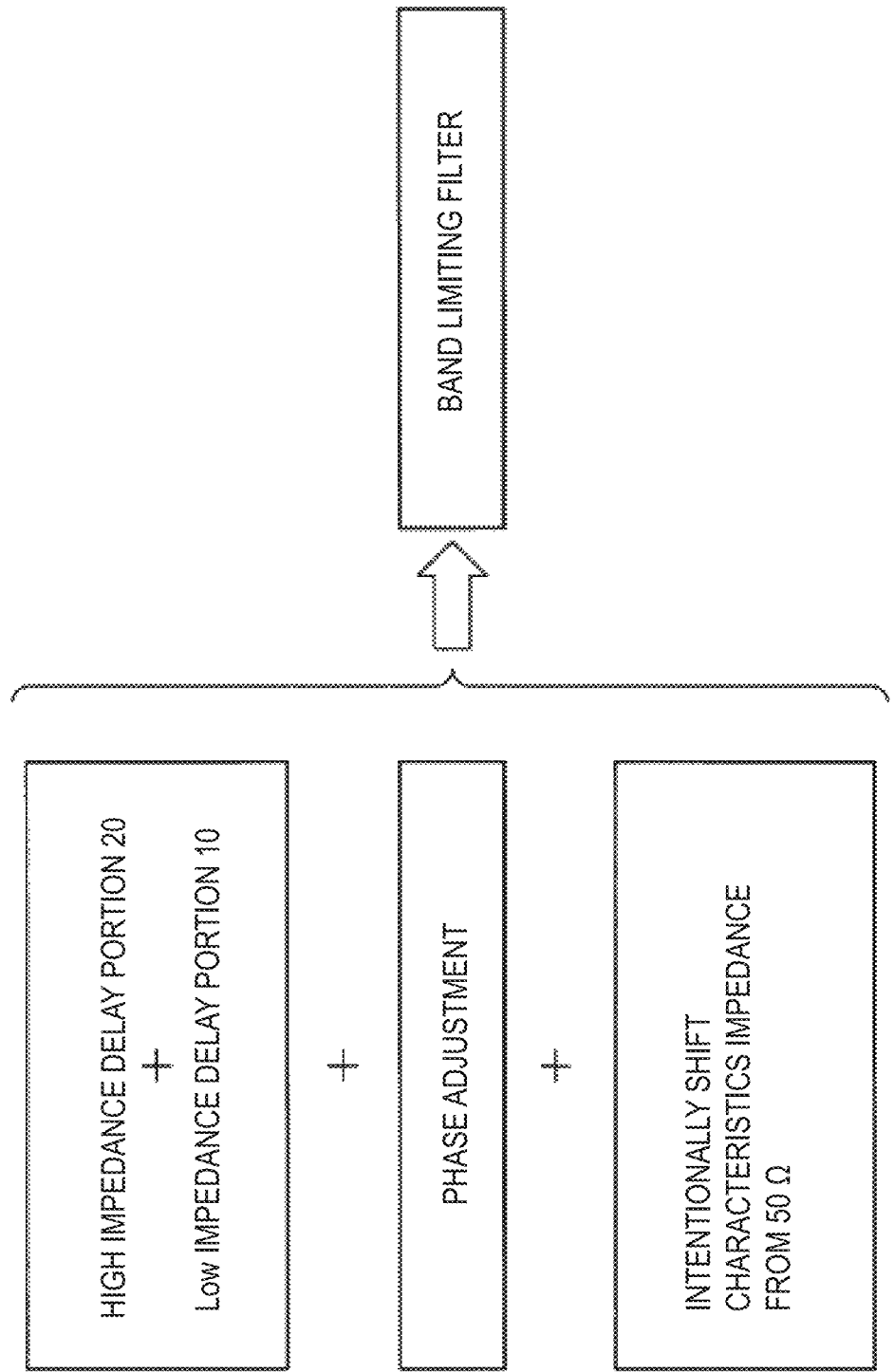
FIG. 19 is a diagram for explaining the basic idea in the present embodiment.

To summarize the above, as shown in FIG. 19, the basic idea in the present embodiment is a technical idea in which the connection part between the mounting substrate and the semiconductor device functions as a band-limiting filter by adjusting the phase of the connection part and devising to shift the characteristic impedance from 50Ω on the assumption that the connection part including the low impedance delay part 10 and the high impedance delay part 20 exists.

Hereinafter, examples of realizing the basic idea in present embodiment by devising layout patterns at the connecting portions between the mounting substrate and the semiconductor device will be described. That is, in the following, a specific configuration will be described in which a layout pattern of a high-impedance delay unit provided in a connection portion between the mounting substrate and the semiconductor device is devised to cause the connection portion to function as a band-limiting filter.

Specific Configuration

Figure 20:
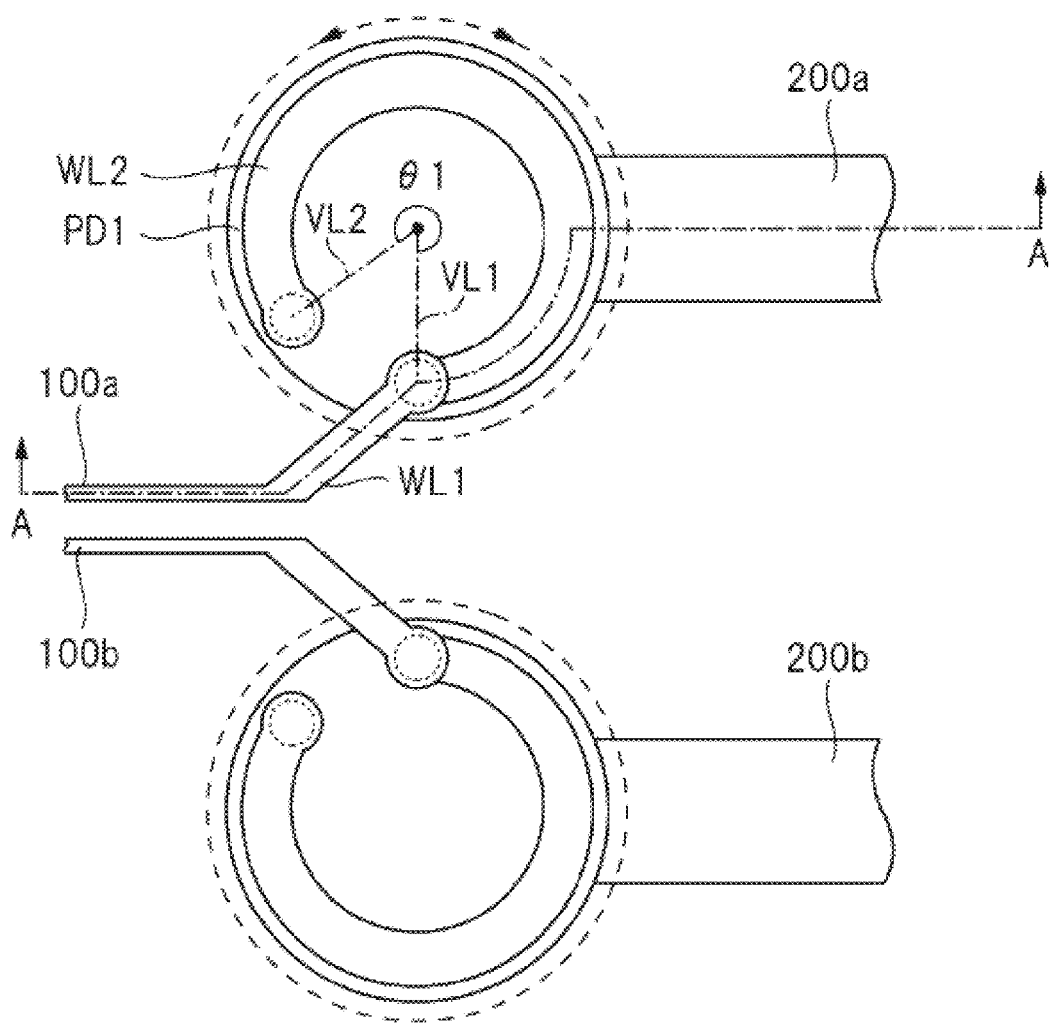
FIG. 20 is a diagram schematically showing the connecting parts between the mounting substrate and the semiconductor device.

FIG. 20 is a diagram schematically showing a connecting portion between the mounting substrate and the semiconductor device.

In FIG. 20, a wiring 100a and a wiring 100b are wirings formed on the semiconductor device wiring substrate, and constitute a differential wiring. On the other hand, the wirings 200a and 200b are wirings formed in the mounting substrate, and constitute differential wirings.

As shown in FIG. 20, the wiring 100a and the wiring 200a are connected by a connecting portion between the mounting substrate and the semiconductor device. Specifically, the connecting portion includes a wiring WL1 connected to the wiring 100a, a wiring WL2 connected to the wiring WL1, and pads PD1 connected to the wiring WL2. At this time, the wiring 100a, the wiring WL1 and the wiring WL2 are signal wirings, and the pad PD1 is a signal pad. In particular, the signal wiring can be composed of, for example, a signal wiring for transmitting a binary digital signal or a signal wiring for transmitting a quaternary digital signal.

Here, the width of the wiring WL1 is larger than the width of the wiring 100a, and the width of the wiring WL2 is larger than the width of the wiring WL1. That is, the relationship of the width of the wiring 100a<the width of the wiring WL1<the width of the wiring WL2 is established. For example, the width of the wiring 100a is 23 µm, and the width of the wiring WL1 is 60 µm. Further, the widths of the wires WL2 are 80 micrometers.

Figure 21:
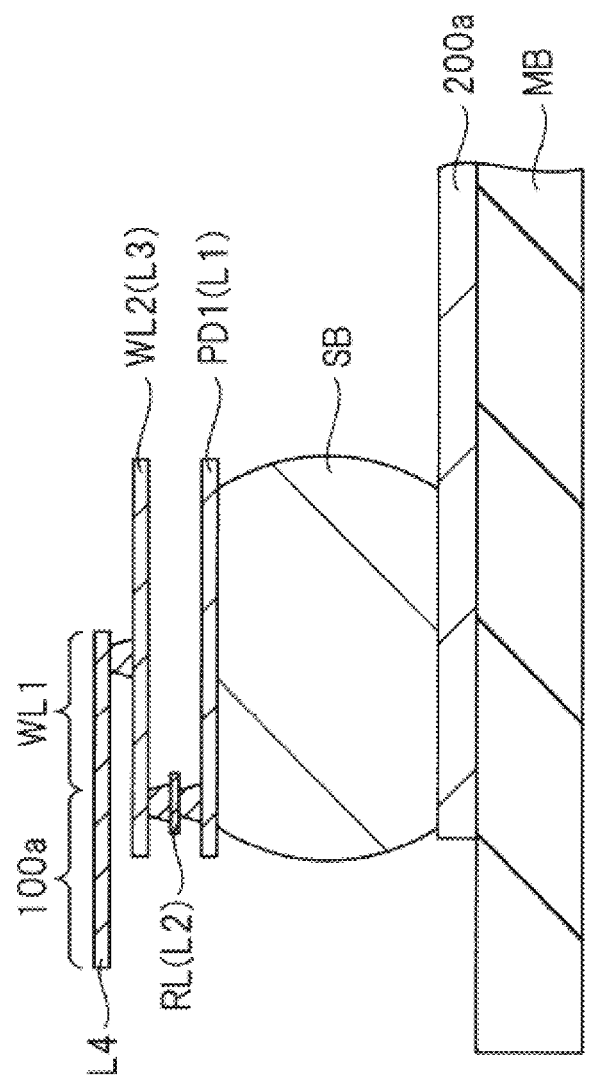
FIG. 21 is a cross-sectional view cut along line A-A of FIG. 20.

FIG. 21 is a cross-sectional view cut along the line A-A in FIG. 20.

In FIG. 21, a wiring 200a is formed on the surface of the mounting substrate MB, and a solder ball SB, which is an external connection terminal, is mounted on the wiring 200a. a pad PD1 is formed on the solder ball SB. The pad PD1 is formed on the wiring substrate of the semiconductor device, and the solder ball SB is disposed so as to be sandwiched between the pad PD1 and the wiring 200a formed on the mounting substrate MB. As a result, the wiring substrate of the semiconductor device and the mounting substrate MB are electrically connected to each other via the solder ball SB.

As shown in FIG. 21, four wiring layers are formed in the wiring substrate, and pads PD1 connected to the solder balls SB are formed in the lowermost wiring layer L1. The planar shape of the padding PD1 includes a circular shape. As shown in FIG. 21, the pads PD1 are connected to the wirings RL formed in the wiring layer L2 above the wiring layer L1 via vias. The wiring RL formed in the wiring layer L2 is connected to the wiring WL2 formed in the wiring layer L3 above the wiring layer L2 through a via portion. As shown in FIG. 20, the interconnection WL2 is disposed so as to overlap with the pads PD1 in plan view. In plan view, the interconnection WL2 extends along the circumference of the pads PD1. In particular, in FIG. 20, the wiring WL2 has one end portion and the other end portion, and the angle θ1 formed by the imaginary line VL1 connecting the center point of the pad PD1 and the one end portion of the wiring WL2 and the imaginary line VL2 connecting the center point of the pad PD1 and the other end portion of the wiring WL2 is 180 degrees or more. In particular, the angle θ1 formed by the imaginary line VL1 and the imaginary line VL2 can be set to an angle greater than or equal to 220 degrees and less than or equal to 340 degrees.

As shown in FIG. 21, the wiring WL2 formed in the wiring layer L3 is connected to the wiring WL1 formed in the wiring layer L4 above the wiring layer L3 via a via portion. The wiring WL1 formed in the wiring layer L4 is connected to the wiring 100a formed in the same wiring layer L4. In this manner, the wiring 100a formed in the wiring substrate and the wiring 200 formed in the mounting substrate MB are electrically connected to each other via the connecting portion between the wiring substrate and the mounting substrate MB. At this time, in FIG. 21, for example, the low-impedance delay unit 10 shown in FIG. 12 is configured by the solder balls SB and the pads PD1. On the other hand, the interconnection WL2 constitutes, for example, the high-impedance delay unit 20 shown in FIG. 12.

Figure 22A:
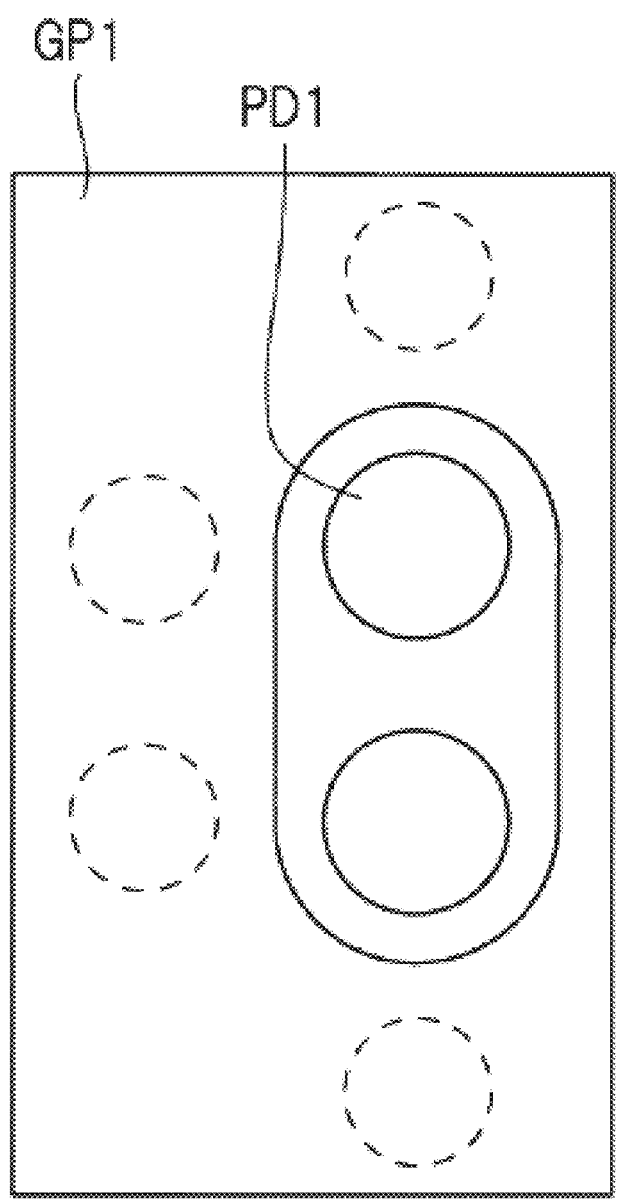
FIG. 22A shows a layout pattern of the first wiring layer.
Figure 22B:
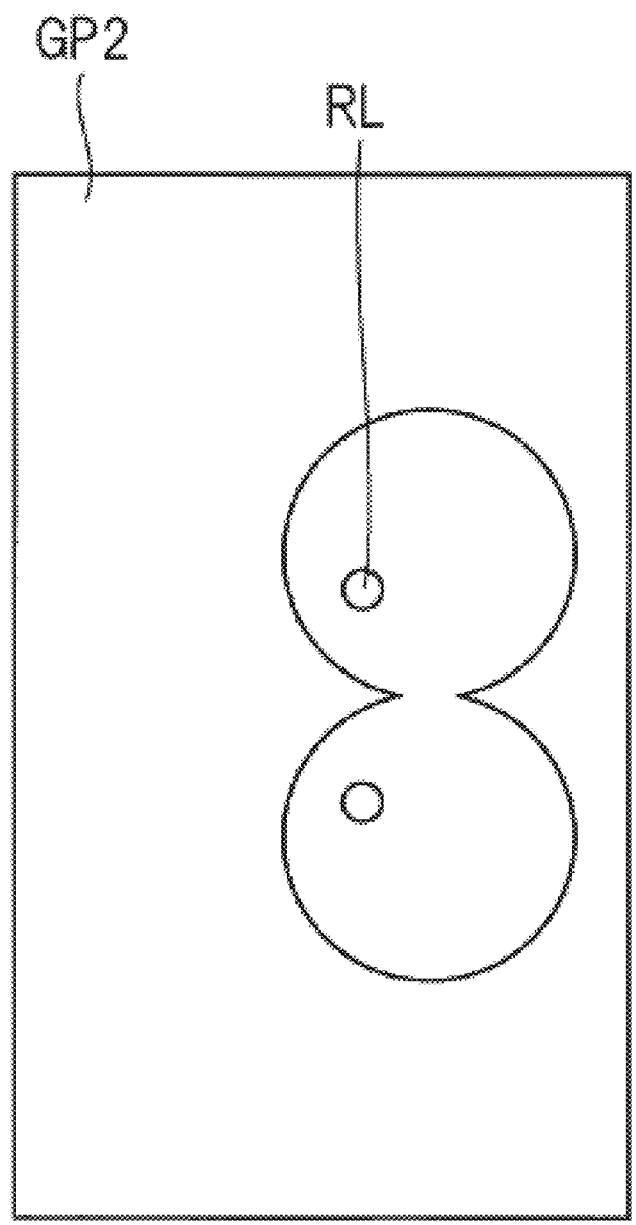
FIG. 22B shows a layout pattern of the second wiring layer.
Figure 22C:
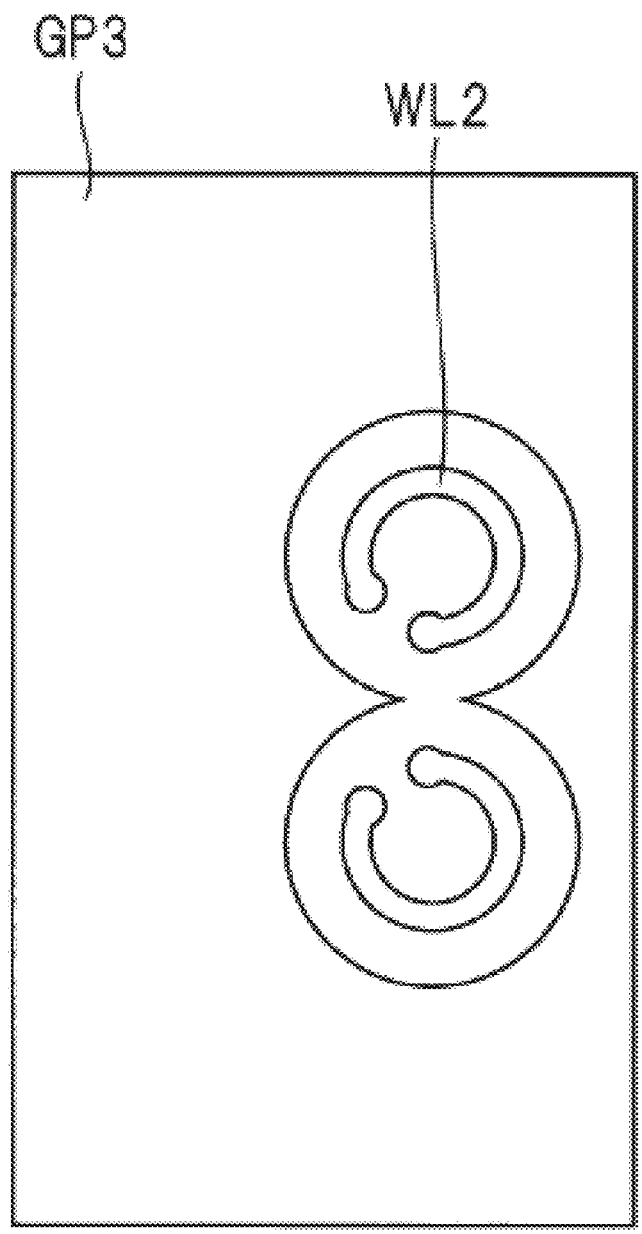
FIG. 22C shows a layout pattern of the third wiring layer.
Figure 22D:
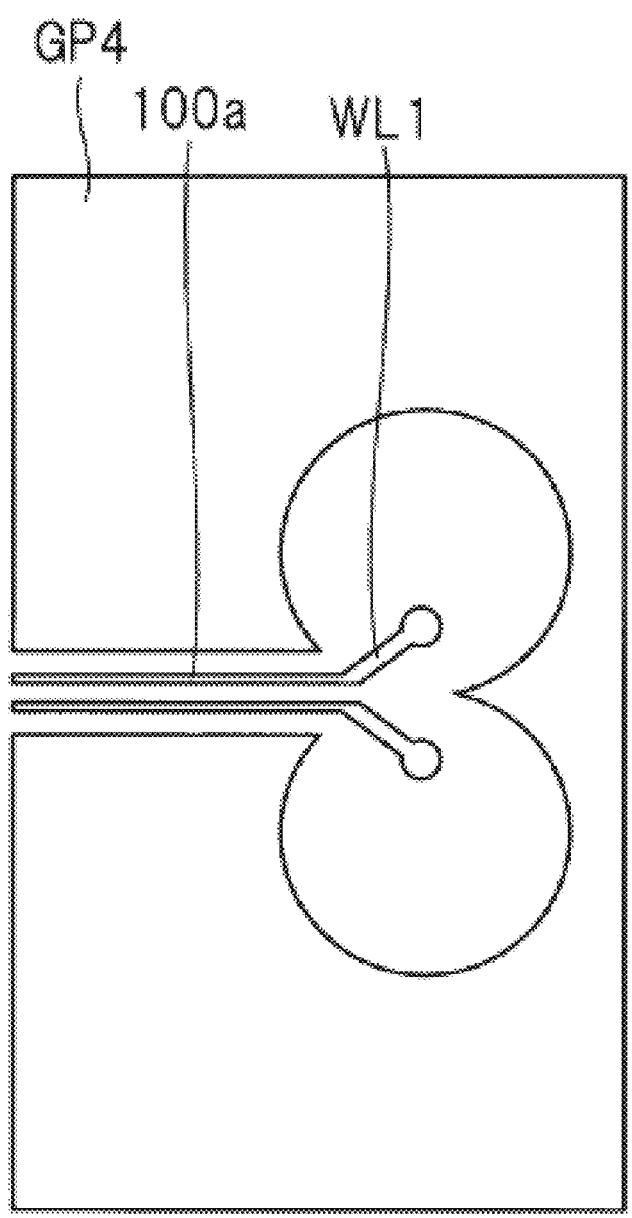
FIG. 22D shows a layout pattern of the fourth wiring layer.

FIGS. 22A and 22B are a plan view schematically showing a layout pattern of each wiring layer constituting the multilayered wiring layer formed in the wiring substrate. In particular, FIG. 22A is a diagram showing a layout pattern of the wiring layer L1, and FIG. 22B is a diagram showing a layout pattern of the wiring layer L2. FIG. 22C is a diagram showing a layout pattern of the wiring layer L3, and FIG. 22D is a diagram showing a layout pattern of the wiring layer L4.

As shown in FIG. 22A, a pad PD1 to which a signal potential (signal voltage) is applied is formed in the interconnection layer L1, and a ground pattern GP1 to which a reference potential (ground voltage) is supplied is formed so as to surround the pad PD1 at a distance from the interconnection layer L1. The broken line indicates the position of the solder ball supplying the ground potential.

Next, as shown in FIG. 22B, ground patterns GP2 to which reference potentials are supplied are formed in the wiring layers L2, and wirings RL electrically connected to the pads PD1 are formed in the wiring layers L2. Subsequently, as shown in FIG. 22C, the ground patterns GP3 to which the reference potential is supplied are formed in the wiring layers L3, and the wiring WL2 electrically connected to the wiring lines RL is formed in the wiring layers L3. Further, as shown in FIG. 22D, a ground pattern GP4 to which a reference potential is supplied is formed in the wiring layer L4, and a wiring WL1 electrically connected to the wiring WL2 and a wiring 100a connected to the wiring WL1 are formed in the wiring layer L4 so as to be separated from the ground pattern GP4.

As described above, in the semiconductor device including the wiring substrate having the front surface and the back surface, the wiring substrate includes the pad PD1 formed on the back surface, the solder ball SB connected to the pad PD1 and serving as an external connection terminal located below the pad PD1, the wiring WL2 electrically connected to the pad PD1 and located above the pad PD, and the wiring 100a electrically connected to the wiring WL2. At this time, the width of the wiring WL2 is larger than the width of the wiring 100a.

In particular, the wiring substrate has a multi wiring structure, the pads PD1 are formed in the wiring layer L1, the wiring WL2 is formed in the wiring layer L3 which is two layers higher than the wiring layer L1, and the wiring 100a is formed in the wiring layer L4 which is one layer higher than the wiring layer L3. The pad PD1 and the wiring WL2 are connected to each other via a wiring (relay wiring) RL formed in the wiring layer L2 located one layer above the wiring layer L1 and one layer below the wiring layer L3, a first via portion connecting the pad PD1 and the wiring RL, and a second via portion connecting the wiring RL and the wiring WL2. Further, the wiring WL2 and the wiring 100a are connected to each other via a third via portion.

Here, as shown in FIG. 20, a wiring WL1 is interposed between the wiring 100a and the wiring WL2, and the width of the wiring 100a is smaller than the width of the wiring WL1, and the width of the wiring WL1 is smaller than the width of the wiring WL2. In other words, when it is considered that the wiring 100a and the wiring WL1 are integrally formed, the wiring 100a includes a narrow portion having a first width and a wide portion having a second width larger than the first width, which corresponds to the wiring WL1, and the wide portion can be said to be provided between the narrow portion and the wiring WL2. At this time, for example, as shown in FIG. 20, the wide portion includes a portion whose width increases from the narrow portion toward the interconnection WL2.

Technical Features in Embodiment

Next, characteristic points in present embodiment will be described.

First, as shown in FIG. 20, for example, the first characteristic point of the present embodiment is that the length and the widths of the interconnection WL2 constituting the high-impedance delay section are adjusted. That is, the first characteristic point of the present embodiment is that the concept of adjusting the phase and the concept of intentionally shifting the characteristic impedances from 50Ω are combined by adjusting the length and the width of the interconnection WL2. More specifically, in present embodiment, as shown in FIG. 20, the length of the wiring WL2 is increased so that the width of the wiring WL2 is larger than the width of the wiring 100a and the angle (rotational angle) θ1 formed by the virtual line VL1 and the virtual line VL2 is 180 degrees or more. As a result, the phase can be adjusted so that the reflected waves at the input end and the output end are reduced. At this time, it is also required to consider adjusting the length and width of the interconnection WL2 so that the characteristic impedance of the connecting portion (low impedance delay portion+high impedance delay portion) can be intentionally shifted from 50Ω. This is because, by combining the idea of phase adjustment and the idea of intentionally shifting the characteristic impedance from 50Ω, high-frequency noise having a higher frequency than the impedance pole can be effectively removed while improving the signal transmission characteristic in a frequency band lower than the impedance pole.

This point will be described below.

Present embodiment uses, for example, a wire WL2 constituting a high-impedance delay unit as a way of adjusting the phase of a high-frequency signal incident on the input end and the phase of a reflected signal reflected at the output end and returned to the input end again to 180 degrees after the high-frequency signal enters from the input end. This is because, when the parasitic inductance of the wiring WL2 is set to "L" and the parasitic capacitance of the wiring WL2 is set to "C", the phase difference between the input end and the output end can be expressed by $\sqrt{(LC)}$, and therefore, by adjusting the parasitic inductance and the parasitic capacitance of the wiring WL2, the phase difference between the input end and the output end can be set to 90 degrees to reduce reflected waves.

Specifically, first, as shown in FIG. 20, the width of the wiring WL2 is made larger than the width of the wiring 100a ("Configuration A"). Since the parasitic capacitances of the interconnection WL2 are increased, it is possible to increase √(LC) indicating the phase differences. Further, as shown in FIG. 20, the length of the interconnection WL2 is lengthened so that the angle (rotational angle) θ1 formed by the virtual line VL1 and the virtual line VL2 becomes 180 degrees or more ("Configuration B"). As a result, since the parasitic inductances of the interconnection WL2 become large, it is possible to increase √(LC) indicating the phase differences. As described above, by employing the "configuration A" and the "configuration B", it is possible to synergistically increase √(LC) indicating the phase difference, and as a result, it is possible to perform phase adjustment for reducing the reflected wave by setting the phase difference between the input end and the output end to 90 degrees. In particular, the combination of "configuration A" and "configuration B" is useful from the viewpoint of adjusting √(LC) indicating the phase difference. This is because, for example, it is difficult to realize the configuration of the wiring WL2 in which the phase difference between the input end and the output end is 90 degrees only by the "configuration A", and it is difficult to realize the configuration of the wiring WL2 in which the phase difference between the input end and the output end is 90 degrees only by the "configuration B". That is, by the synergistic effects of combining the "configuration A" and the "configuration B", the configuration of the interconnection WL2 in which the phase difference between the input end and the output end is 90 degrees can be easily realized.

In this manner, according to the first characteristic point in the present embodiment, the basic idea in the present embodiment can be embodied. That is, according to the first characteristic point of the present embodiment, by devising the layout pattern of the high-impedance delay unit provided in the connection portion between the mounting substrate and the semiconductor device, the connection portion can function as the band-limiting filter. As a result, according to the first characteristic point of the present embodiment, it is possible to reduce high-frequency noises while improving the signal transmission characteristics.

Hereinafter, a result of supporting that the first characteristic point in the present embodiment can reduce high-frequency noises while improving the signal transmission performance will be described.

Figure 23:
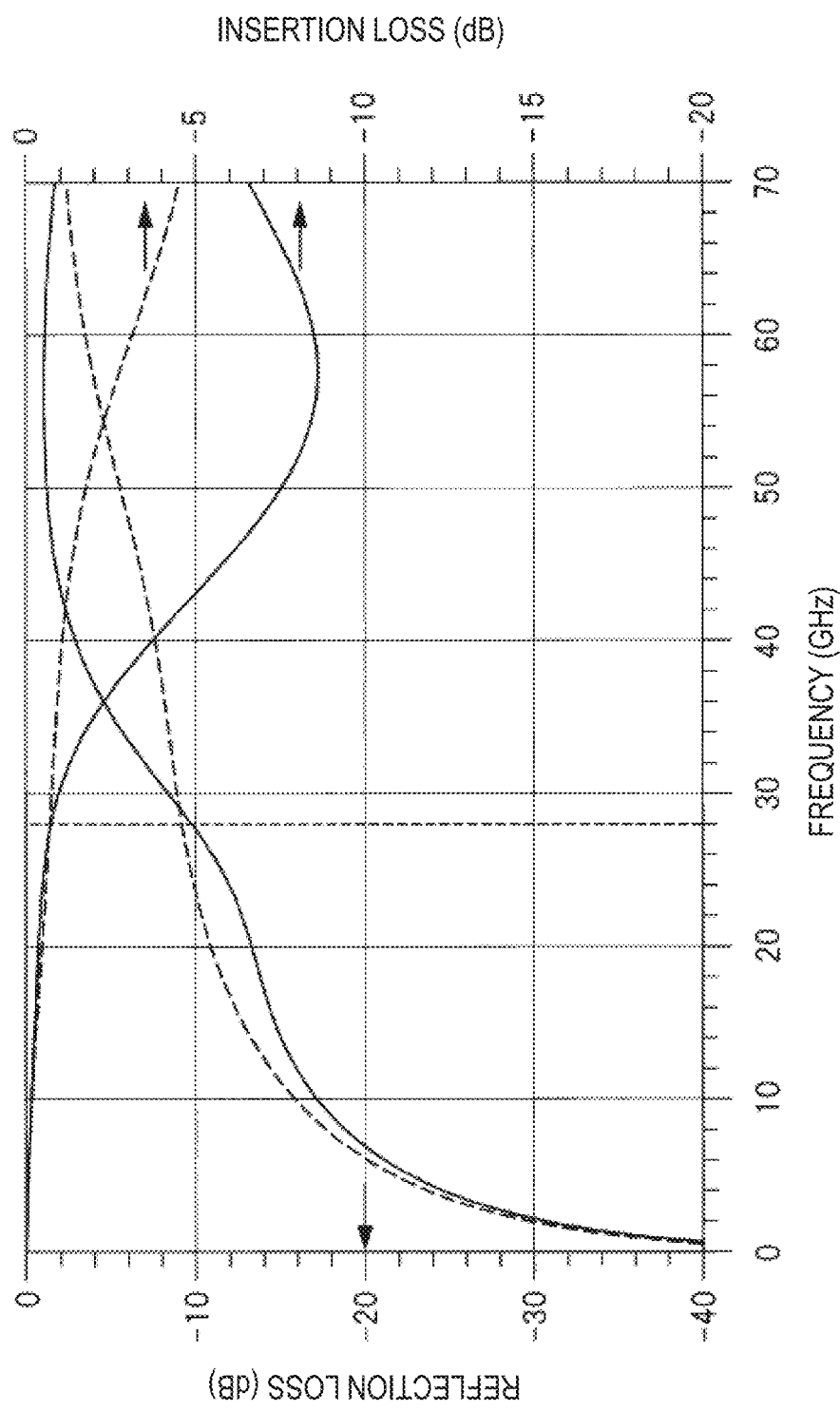
FIG. 23 is a graph showing the result of comparing the connection structure of the countermeasure shown in FIG. 11 with the connection structure in the present embodiment shown in FIG. 20 with respect to the frequency dependence of the reflection loss and the frequency dependence of the insertion loss.

FIG. 23 is a graph showing the result of comparing the connection structure of the countermeasure shown in FIG. 11 with the connection structure in the present embodiment shown in FIG. 20 with respect to the frequency dependence of the reflection loss and the frequency dependence of the insertion loss. In FIG. 23, the dotted line is a graph corresponding to the connection structure of the countermeasure proposal, and the solid line is a graph corresponding to the connection structure of the present embodiment. In FIG. 23, the horizontal axis represents the frequency. On the other hand, in FIG. 23, the vertical axis on the left side indicates the reflection loss, and the vertical axis on the right side indicates the insertion loss.

First, in FIG. 23, the dotted line showing the graph corresponding to the connection structure of the countermeasure proposal shows that the insertion loss is small even in the frequency band higher than the frequency of 28 GHz which is twice the Nyquist frequency. This means that, in the connecting structures of the proposed countermeasures, not only signals having a frequency lower than twice the Nyquist frequency (28 GHz) but also high-frequency noise having a frequency higher than twice the Nyquist frequency (28 GHz) are passed well, thereby deteriorating the noise tolerance of the semiconductor device.

On the other hand, in FIG. 23, it can be seen that in the solid line showing graphs corresponding to the present embodiment connecting structures, the insertion loss can be reduced in a frequency band lower than the frequency (28 GHz) twice the Nyquist frequency, while in a frequency band higher than the frequency (28 GHz) twice the Nyquist frequency, the insertion loss is larger than in the countermeasure proposal. This means that, in present embodiment connects, signals lower than twice the Nyquist frequency (28 GHz) pass well, while high frequency noises higher than twice the Nyquist frequency (28 GHz) can be blocked. As a result, it can be seen that the connecting structures in the present embodiment function as a band-limiting filter and can reduce high-frequency noises while improving the signal transmission performance. Thus, according to the present embodiment, it can be seen that the performance of the semiconductor device can be improved as compared with the countermeasure proposal.

As shown in FIG. 12, for example, the connecting structure in present embodiment is a two-stage L/C ladder structure composed of a low impedance delay portion 10 and a high impedance delay portion 20, and the number of impedance poles is one. However, the number of impedance poles can be increased by increasing the number of stages of the L/C ladder structure. For example, when the frequency of the high-frequency noise is high and the cutoff frequency for cutting off the high-frequency noise is set to a higher frequency, it is considered that the L/C ladder structure having one impedance pole and two stages is insufficient. In this instance, for example, an additional high-impedance delay section is added to the mounting substrate, or an additional low-impedance delay section is inserted between the high-impedance delay section 20 and the wiring of the wiring substrate, i.e., a transmission line having a characteristic impedance of 50Ω, thereby increasing the cutoff frequency for cutting off high-frequency noises.

Next, the second characteristic point of present embodiment is, for example, as shown in FIG. 20, that a wiring WL1 having a width larger than that of the wiring 100a and a width smaller than that of the wiring WL2 is provided between the wiring 100a and the wiring WL2. As a result, discontinuities in the characteristic impedances at the boundaries between the wiring 100a having a small width and the wiring WL2 having a large width can be alleviated. That is, in present embodiment, the phase is adjusted by increasing the width of the wiring WL2 constituting the high impedance delay section 20, but in this instance, discontinuities in the characteristic impedance at the border between the wiring 100a having a small width and the wiring WL2 having a large width become apparent, and there is a fear that the reflection loss becomes large and the reflection loss becomes difficult to design. In this regard, by employing the second characteristic point in the present embodiment, the discontinuities in the characteristic impedances are alleviated, and as a result, it is possible to suppress that the reflection loss becomes large and the design becomes difficult. In particular, from the viewpoint of alleviating discontinuities in the characteristic impedances at the boundaries between the wiring 100a having a small width and the wiring WL2 having a large width while employing the first characteristic point in the present embodiment, it is desirable that the planar shape of the wiring WL1 has a shape in which the width gradually increases from the wiring 100a side toward the wiring WL2 side. In this instance, discontinuities in the characteristic impedances at the boundaries between the wiring 100a having a small width and the wiring WL2 having a large width can be sufficiently reduced.

Next, the third characteristic point of the present embodiment is that, for example, as shown in FIG. 20, the interconnection WL2 constituting the high-impedance delay portion is formed along the circumference of the circular pad PD1 in plan view. Thus, according to the present embodiment, the semiconductor device can be designed independently regardless of the design of the mounting substrate.

The reason for this will be described below.

In FIG. 20, the wiring 200a formed on the mounting substrate and the pad PD1 are connected by a solder ball (not shown in FIG. 20), and the current flowing through the wiring 200a flows in the pad PD1 along the height direction (perpendicular direction) of the solder ball. This means that the magnetic field generated due to the current flowing through the solder ball is generated along the circumferential directions of the pads PD1, as shown in FIG. 20, according to Ampere's law. At this time, since the wiring WL2 constituting the high-impedance delay portion is arranged along the circumferential directions of the pads PD1, the wiring WL2 is arranged in parallel with the magnetic field generated by the current flowing through the solder balls. As a result, the high-impedance delay portion (wiring WL2) formed in the wiring substrate of the semiconductor device can eliminate mutual inductances due to interferences with currents flowing directly below (soldering balls). This means that the band-limiting filter by the high-impedance delay portion (wiring WL2) formed in the wiring substrate can be made to function without being affected by the design of the mounting substrate. In other words, according to the third characteristic point of the present embodiment, even when a semiconductor device is mounted on various mounting substrate differing in design, the band-limiting filter formed in the semiconductor device can be made to function without changing the design of the wiring substrate side of the semiconductor device. As a result, according to the third characteristic point of the present embodiment, it is possible to achieve both the improvement of the signal transmission performance and the reduction of the high-frequency noise while ensuring the versatility of the semiconductor device.

Modified Example 1

Next, first modified example will be described.

Figure 24:
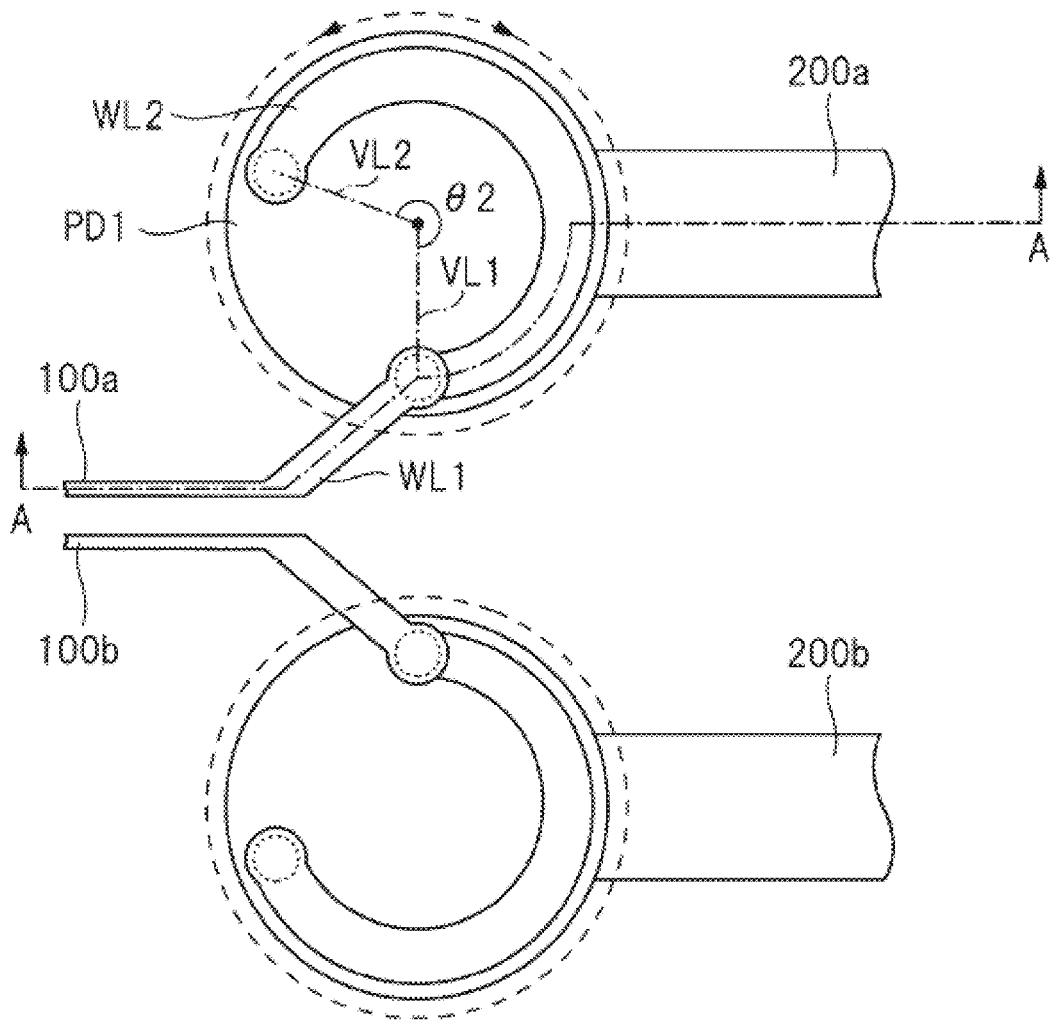
FIG. 24 is a diagram showing the connecting parts between the mounting substrate and the semiconductor device in the present first modified example.

FIG. 24 is a diagram showing a connecting portion between the mounting substrate and the semiconductor device in the present first modified example.

In FIG. 24, a wiring 100a and a wiring 100b are wirings formed on the semiconductor device wiring substrate, and constitute a differential wiring. On the other hand, the wirings 200a and 200b are wirings formed in the mounting substrate, and constitute differential wirings.

As shown in FIG. 24, the wiring 100a and the wiring 200a are connected by a connecting portion between the mounting substrate and the semiconductor device. Specifically, the connecting portion includes a wiring WL1 connected to the wiring 100a, a wiring WL2 connected to the wiring WL1, and pads PD1 connected to the wiring WL2. Here, also in the present first modified example, the width of the wiring WL1 is larger than the width of the wiring 100a, and the width of the wiring WL2 is larger than the width of the wiring WL1. That is, the relationship of the width of the wiring 100a<the width of the wiring WL1<the width of the wiring WL2 is established.

Figure 25:
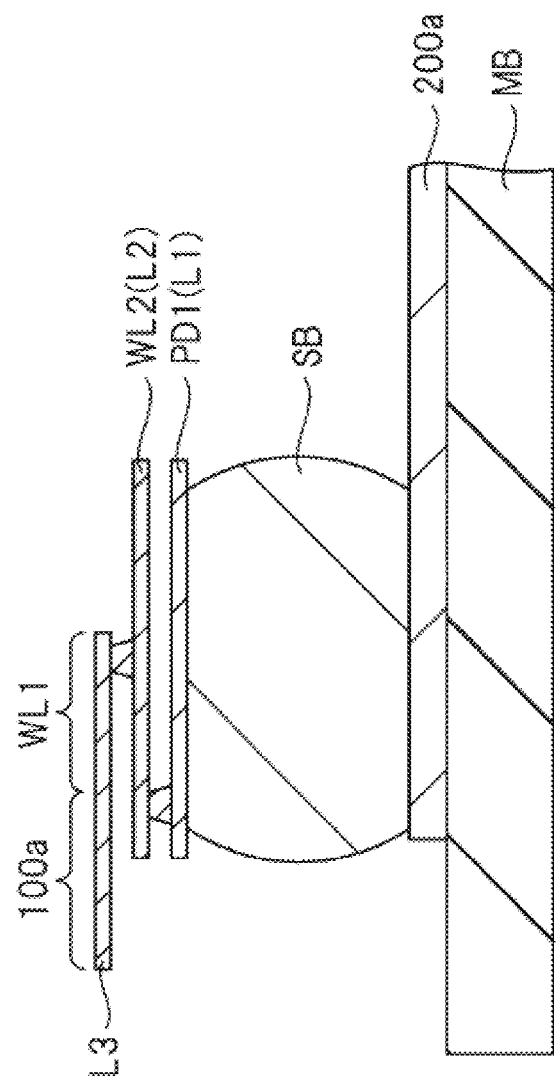
FIG. 25 is a cross-sectional view cut along line A-A of FIG. 24.

FIG. 25 is a cross-sectional view cut along the line A-A in FIG. 24.

In FIG. 25, a wiring 200a is formed on the surface of the mounting substrate MB, and a solder ball SB, which is an external connection terminal, is mounted on the wiring 200a. A pad PD1 is formed above the solder ball SB. The pad PD1 is formed on the wiring substrate of the semiconductor device, and the solder ball SB is disposed so as to be sandwiched between the pad PD1 and the wiring 200a formed on the mounting substrate MB. As a result, the wiring substrate of the semiconductor device and the mounting substrate MB are electrically connected to each other via the solder balls SB.

As shown in FIG. 25, three wiring layers are formed in the wiring substrate, and pads PD1 connected to the solder balls SB are formed in the lowermost wiring layer L1. The planar shape of the padding PD1 includes a circular shape. As shown in FIG. 25, the pad PD1 is connected with the wiring WL2 formed in the wiring layer L2 located above the wiring layer L1 by way of a via portion. As shown in FIG. 24, the interconnection WL2 is disposed so as to overlap with the pads PD1 in plan view. In plan view, the interconnection WL2 extends along the circumference of the pads PD1. In particular, in FIG. 24, the wiring WL2 has one end portion and the other end portion, and the angle θ2 formed by the imaginary line VL1 connecting the center point of the pad PD1 and the one end portion of the wiring WL2 and the imaginary line VL2 connecting the center point of the pad PD1 and the other end portion of the wiring WL2 is 180 degrees or more. As shown in FIG. 25, the wiring WL2 formed in the wiring layer L2 is connected to the wiring WL1 formed in the wiring layer L3 above the wiring layer L2 through a via portion. The wiring WL1 formed in the wiring layer L3 is connected to the wiring 100a formed in the same wiring layer L3. In this manner, the wiring 100a formed in the wiring substrate and the wiring 200 formed in the mounting substrate MB are electrically connected to each other via the connecting portion between the wiring substrate and the mounting substrate MB.

Here, the difference between the connection portion in the present first modified example shown in FIG. 25 and the connection portion in the embodiment shown in FIG. 21 is that, in the embodiment shown in FIG. 21, the multilayer wiring layer formed in the wiring substrate is formed of four layers (wiring layer L1 to wiring layer L4), whereas in the present first modified example shown in FIG. 25, the multilayer wiring layer formed in the wiring substrate is formed of three layers (wiring layer L1 to wiring layer L3). In particular, in the embodiment shown in FIG. 21, the wiring WL2 constituting the high-impedance delay portion is formed in the wiring layer L3, and this wiring WL2 is electrically connected to the pad PD1 formed in the wiring layer L1 under the wiring layer L2 via the wiring RL formed in the wiring layer L2 under the wiring layer L3. In contrast, in the present first modified example shown in FIG. 25, the wiring WL2 constituting the high-impedance delay portion is formed in the wiring layer L2, and the wiring WL2 is electrically connected to the pads PD1 formed in the wiring layer L1 below the wiring layer L2. That is, in the embodiment shown in FIG. 21, the wiring RL is interposed between the wiring WL2 and the pad PD1 in the thickness direction of the wiring substrate, whereas in the present first modified example shown in FIG. 25, the wiring RL is not interposed between the wiring WL2 and the pad PD1 in the thickness direction of the wiring substrate. As a result, in the present modified example, distances between the wires WL2 and the pads PD1 are smaller than those in the embodiment. This means that the mutual inductances between the interconnection WL2 and the pads PD1 are larger in the present modified example than in the embodiment. As a result, in the present first modified example, since the parasitic inductance can be increased without making the length of the interconnection WL2 constituting the high-impedance delay section longer than in the embodiment, the phase difference between the input end and the output end can be adjusted to 90 degrees. That is, as can be seen by comparing FIG. 20 and FIG. 24, the angle θ2 in the present first modified example can be made smaller than the angle θ1 in the embodiment, but the phase difference between the input end and the output end can be adjusted to 90 degrees.

Figure 26A:
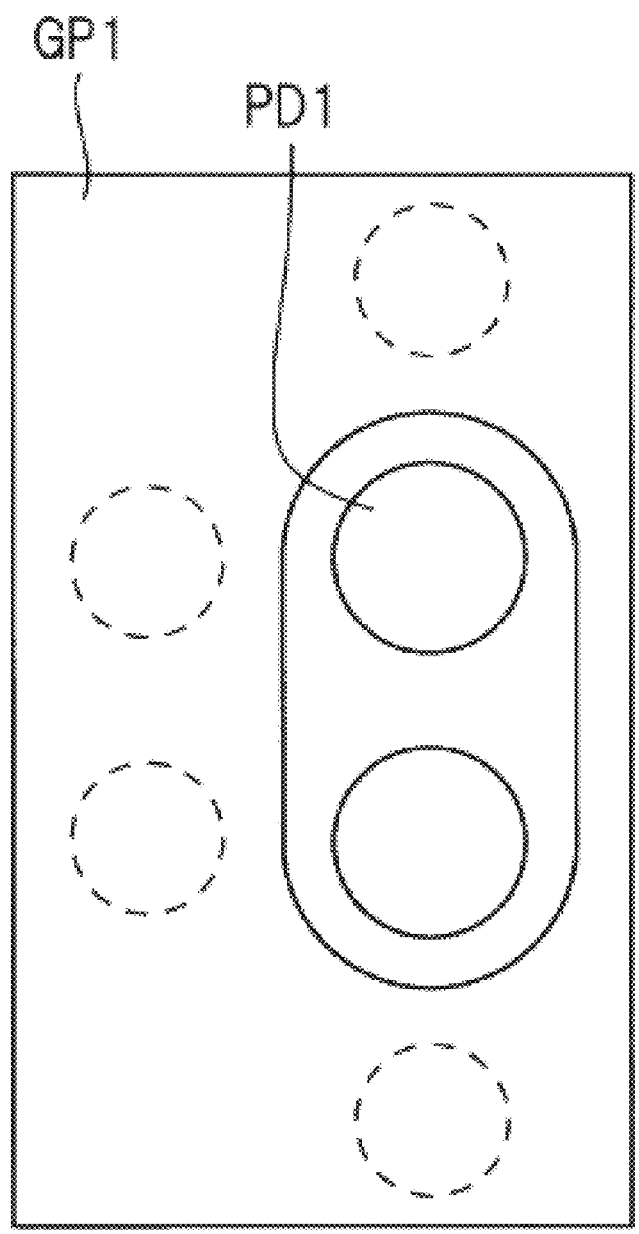
FIG. 26A shows a layout pattern of the first wiring layer.
Figure 26B:
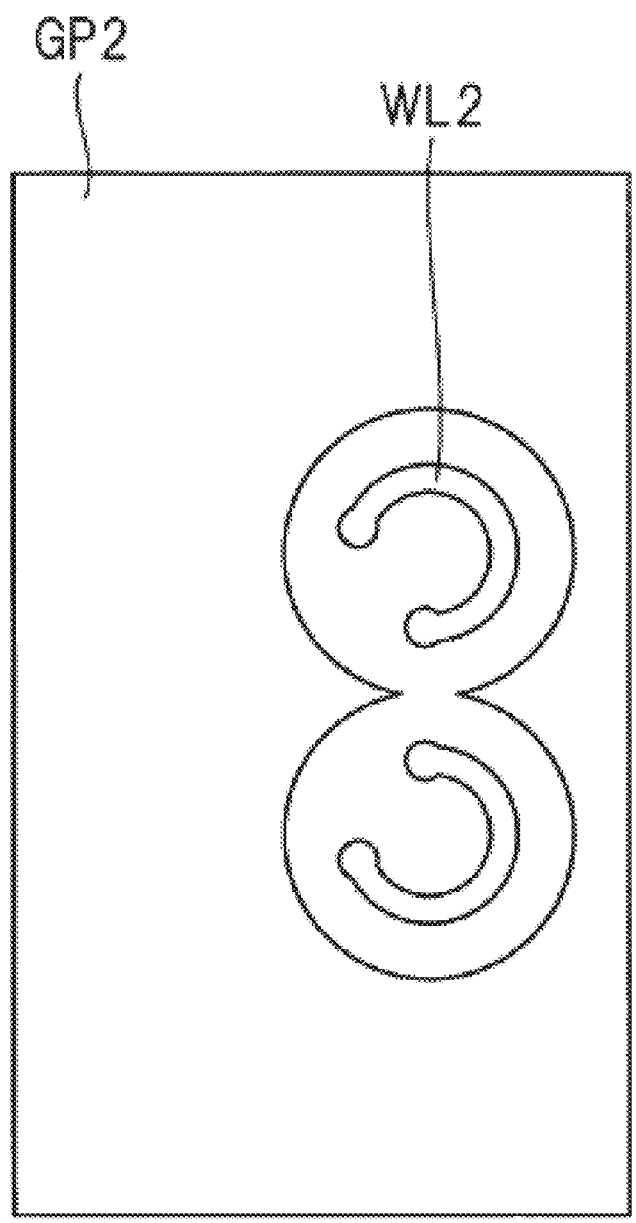
FIG. 26B shows a layout pattern of the second wiring layer, and 26C shows a layout pattern of the third wiring layer.
Figure 26C:
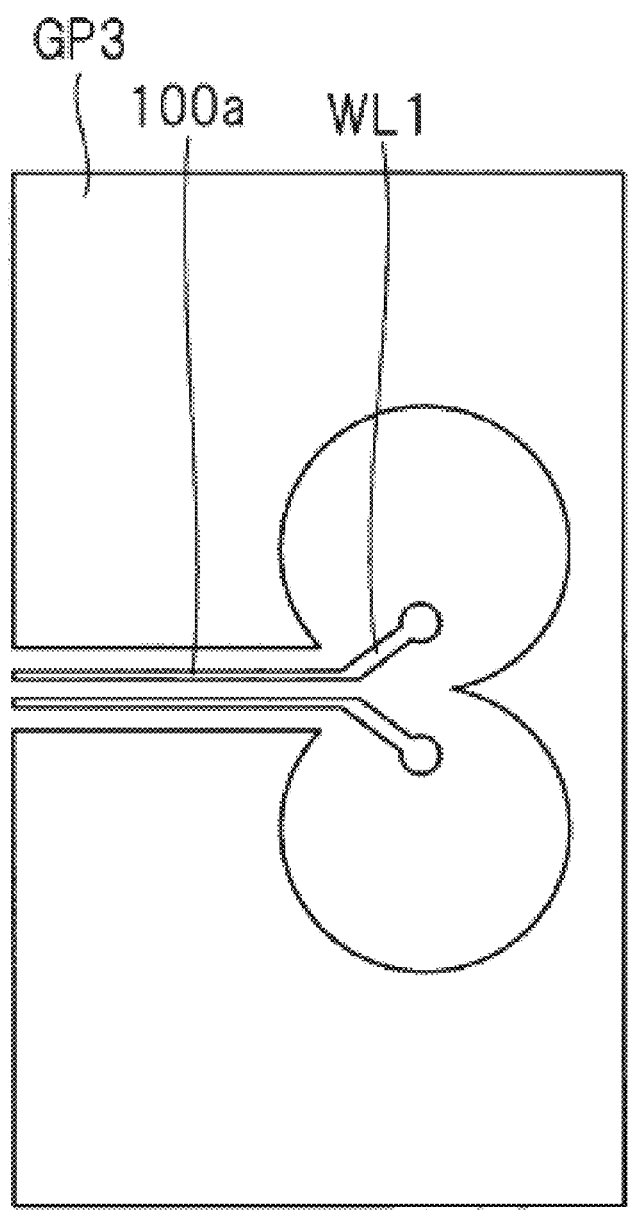

FIGS. 26A and 26B are a plan view schematically showing a layout pattern of each wiring layer constituting the multilayered wiring layer formed in the wiring substrate. In particular, FIG. 26A is a diagram showing a layout pattern of the wiring layer L1, and FIG. 26B is a diagram showing a layout pattern of the wiring layer L2. FIG. 22C is a diagram showing a layout pattern of the wiring layer L3.

As shown in FIG. 26A, a pad PD1 to which a signal potential (signal voltage) is applied is formed in the interconnection layer L1, and a ground pattern GP1 to which a reference potential (ground voltage) is supplied is formed so as to surround the pad PD1 at a distance from the interconnection layer L1. A solder ball connecting the ground pattern GP1 and the mounting substrate is placed at a position indicated by a broken line.

Next, as shown in FIG. 22B, a ground pattern GP2 to which a reference potential is supplied is formed in the wiring layer L2, and a wiring WL2 electrically connected to the pads PD1 is formed in the wiring layer L2. Subsequently, as shown in FIG. 22C, a ground pattern GP3 to which a reference potential is supplied is formed in the wiring layer L3, and a wiring WL1 electrically connected to the wiring WL2 and a wiring 100a connected to the wiring WL1 are formed in the wiring layer L3 so as to be separated from the ground pattern GP3.

Hereinafter, the results of the present first modified example will be described to confirm that high-frequency noises can be reduced while improving the signal transmission performance.

Figure 27:
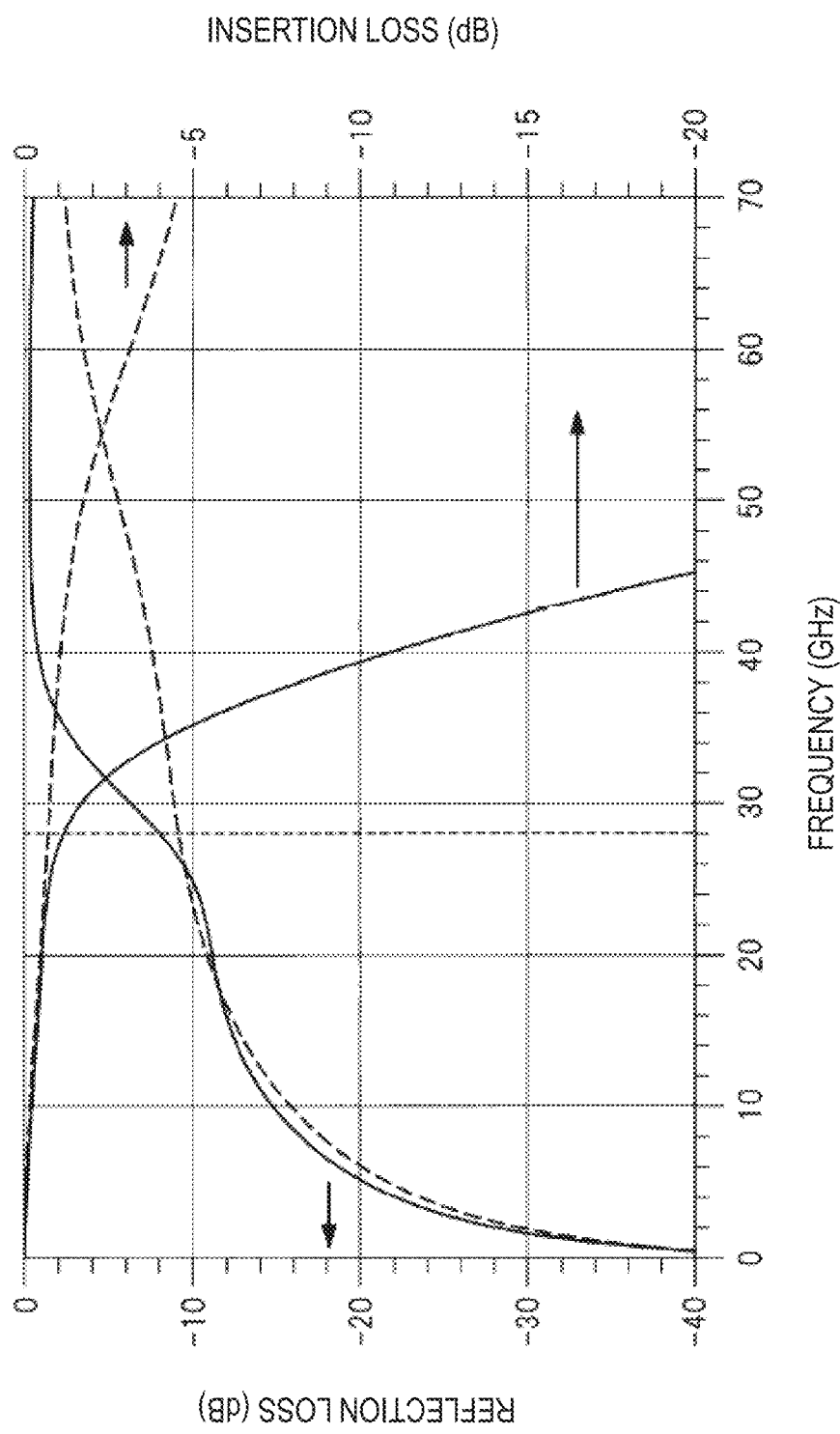
FIG. 27 is a graph showing the result of comparing the connection structure of the countermeasure shown in FIG. 11 and the connection structure in the present first modified example shown in FIG. 24 with respect to the frequency dependence of the reflection loss and the frequency dependence of the insertion loss.

FIG. 27 is a graph showing the result of comparing the connection structure of the countermeasure shown in FIG. 11 and the connection structure in the present first modified example shown in FIG. 24 with respect to the frequency dependence of the reflection loss and the frequency dependence of the insertion loss. In FIG. 27, the dotted line is a graph corresponding to the connection structure of the countermeasure proposal, and the solid line is a graph corresponding to the connection structure of the present first modified example. In FIG. 27, the horizontal axis represents the frequency. On the other hand, in FIG. 27, the vertical axis on the left side indicates the reflection loss, and the vertical axis on the right side indicates the insertion loss.

First, in FIG. 27, the dotted line showing the graph corresponding to the connection structure of the countermeasure proposal shows that the insertion loss is small even in the frequency band higher than the frequency of 28 GHz which is twice the Nyquist frequency. This means that, in the connecting structures of the proposed countermeasures, not only signals having a frequency lower than twice the Nyquist frequency (28 GHz) but also high-frequency noise having a frequency higher than twice the Nyquist frequency (28 GHz) are passed well, thereby deteriorating the noise tolerance of the semiconductor device.

On the other hand, in FIG. 27, it can be seen from the solid line showing graphs corresponding to the connecting structures of the present first modified example that the insertion loss can be reduced in the frequency band lower than the frequency (28 GHz) twice the Nyquist frequency, while the insertion loss is remarkably increased in the frequency band higher than the frequency (28 GHz) twice the Nyquist frequency as compared with the countermeasure proposal. This means that in the interconnect of the present first modified example, signals lower than twice the Nyquist frequency (28 GHz) pass well, while high frequency noises higher than twice the Nyquist frequency (28 GHz) can be blocked. As a result, it can be seen that the connecting structures of the present first modified example can function as a band-limiting filter, and can reduce high-frequency noises while improving the signal transmission performance. As a result, according to the present first modified example, it is possible to improve the performance of the semiconductor device as compared with the countermeasure proposal.

Furthermore, when comparing the graph (solid line) corresponding to the connection structure of the present first modified example shown in FIG. 27 with the graph (solid line) corresponding to the connection structure of the embodiment shown in FIG. 23, it can be seen that the insertion loss of the present first modified example is remarkably larger than the insertion loss of the present embodiment at a frequency higher than a frequency (28 GHz) twice as high as the Nyquist frequency. This means that the first modified example has a higher cutoff performance against high-frequency noises than the embodiment at a frequency twice as high as the Nyquist frequency (28 GHz). As described above, the connection structure of the present first modified example realizes the band-limiting filter of higher performance than the connection structure of the embodiment, and it is understood that high-frequency noises can be reduced while improving the signal transmission performance in the present first modified example.

Next, in the connection structure of the present first modified example and the connection structure of the countermeasure proposal, the results of comparing the resistance to high-frequency noises by simulations will be described.

In the simulations, for example, sinusoidal high-frequency noises are injected from the signal-input-pin positions of the semiconductor device. This high-frequency noise is synthesized into a high-frequency signal (56 Gbps/PAM4 signal) transmitted from the transmitter to the semiconductor device, and the synthesized high-frequency noise is inputted to the semiconductor device. After that, the high-frequency signal on which the high-frequency noise is superimposed reaches the receiving unit, and thereafter, the waveform is shaped by, for example, an equalizer. The received waveforms after the waveform shaping are compared.

At this time, if the frequency of the high-frequency noise, which is a sine wave, is a rational multiple (in particular, an integer multiple) of the Nyquist frequency of the high-frequency signal, the influence of the high-frequency noise does not appear, so that the frequency of the high-frequency noise to be added is an irrational multiple of the Nyquist frequency of the high-frequency signal.

Figure 28A:
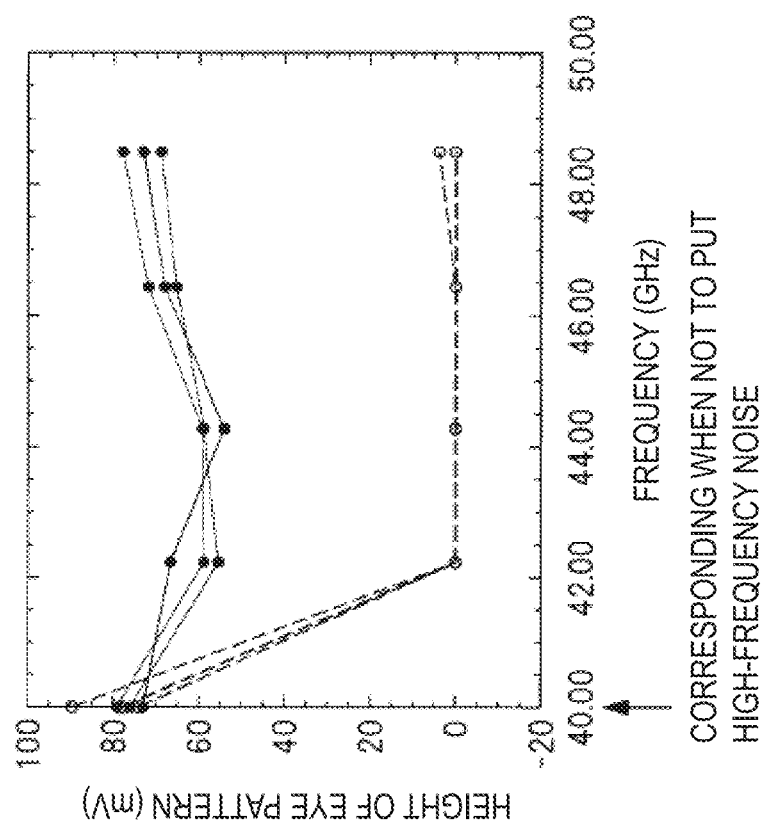
FIG. 28A is a graph showing the frequency dependence of the height of the eye pattern.
Figure 28B:
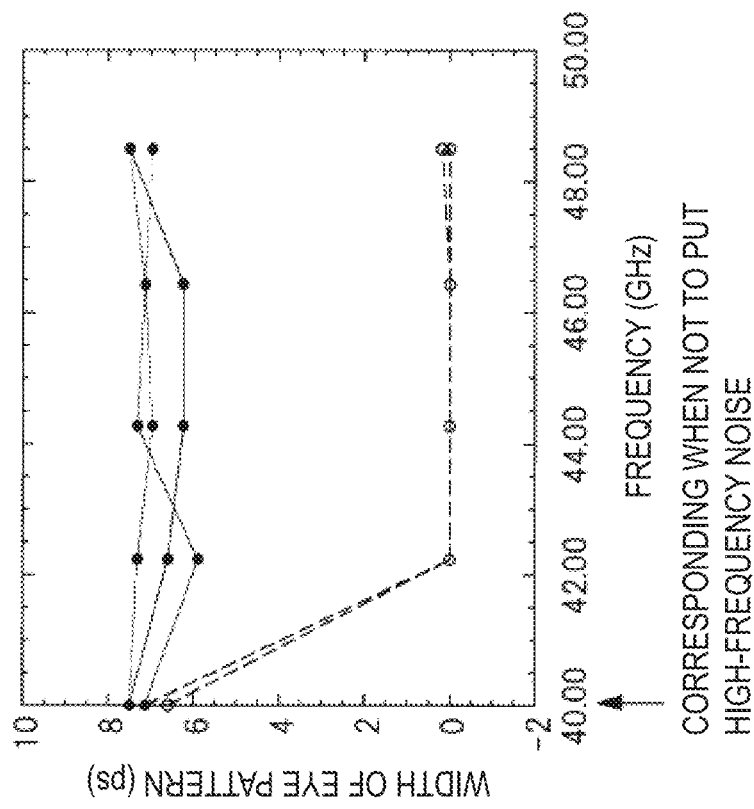
FIG. 28B is a graph showing the frequency dependence of the width of the eye pattern.

FIGS. 28A and 28B are a graph showing the frequency dependence of the height and width of the eye pattern in the case where the insertion loss is 1 dB or less and the insertion loss is about twice the Nyquist frequency of the high-frequency signal.

In particular, FIG. 28A is a graph showing the frequency dependence of the height of the eye pattern, and FIG. 28B is a graph showing the frequency dependence of the width of the eye pattern.

First, in FIG. 28A and FIG. 28B, the dotted line is a graph corresponding to the connection structure of the countermeasure proposal, and the solid line is a graph corresponding to the connection structure of the present first modified example.

As shown in FIG. 28A and FIG. 28B, when high-frequency noises are injected, the eye pattern is completely closed in the countermeasure plan shown by the dotted line, whereas the eye pattern is not much changed in the present first modified example shown by the solid line. In other words, this first modified example is less susceptible to high-frequency noise and is highly resistant to high-frequency noise.

Figure 29A:
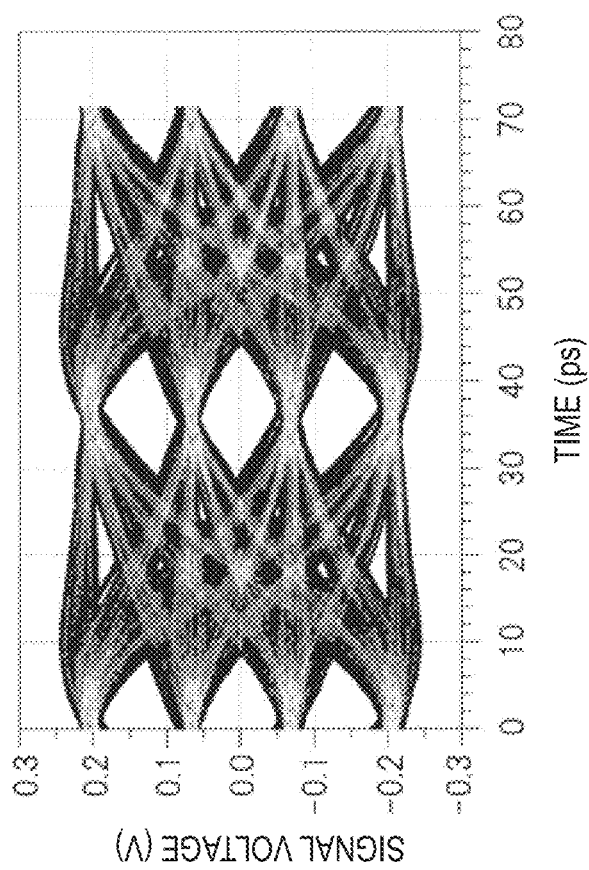
FIG. 29A shows the eye pattern in the countermeasure plan when there is no high-frequency noise.
Figure 29B:
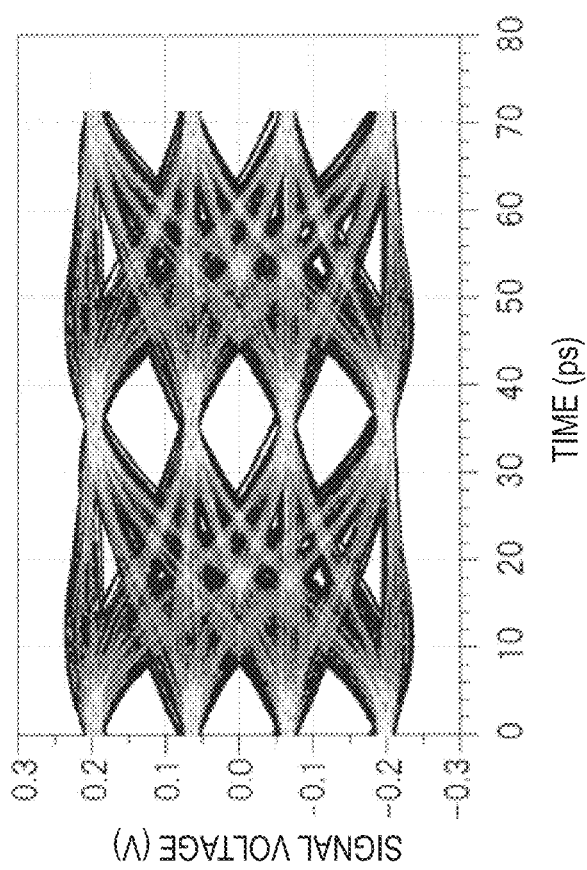
FIG. 29B shows the eye pattern in first modified example when there is no high-frequency noise.
Figure 30A:
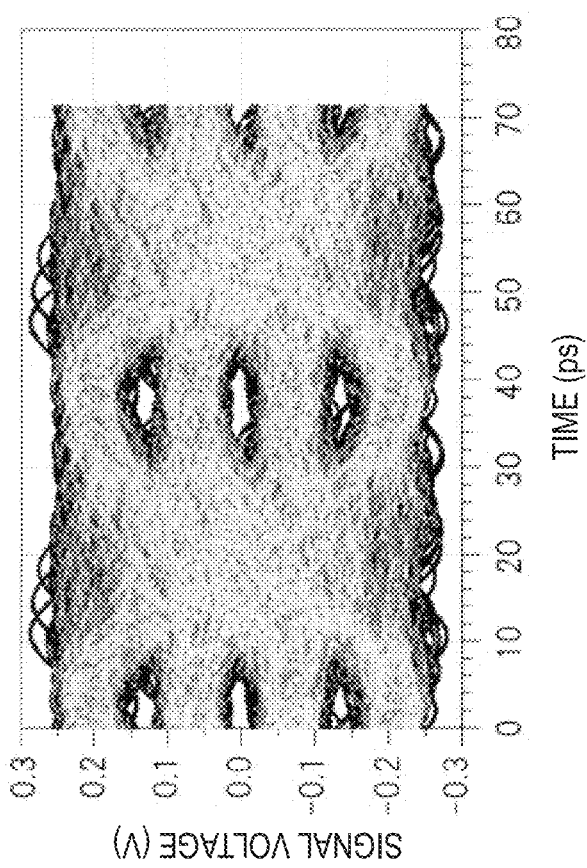
FIG. 30A shows the eye pattern in the countermeasure plan when there is high-frequency noise.
Figure 30B:
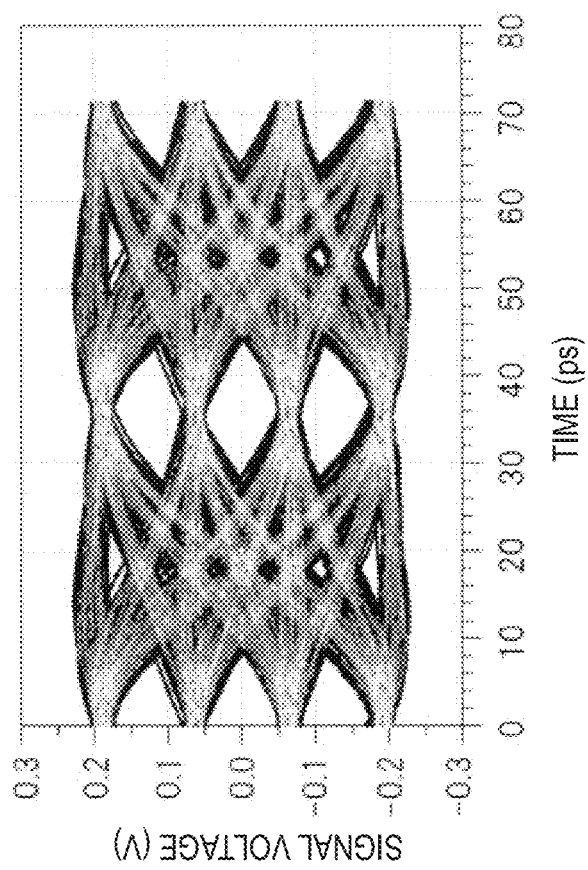
FIG. 30B shows the eye pattern in first modified example when there is high-frequency noise.

Specifically, FIG. 29A is a diagram showing the eye pattern in the countermeasure plan in the case where there is no high-frequency noise, and FIG. 29B is a diagram showing the eye pattern in the present first modified example in the case where there is no high-frequency noise. On the other hand, FIG. 30A is a diagram showing the eye pattern in the countermeasure proposal when there is high-frequency noise, and FIG. 30B is a diagram showing the eye pattern in the present first modified example when there is high-frequency noise.

As shown in FIG. 29A and FIG. 29B, it can be seen that the reception waveforms when no high-frequency noises are added are substantially the same in the countermeasure proposal and the present first modified example. On the other hand, as shown in FIGS. 30A and 30B, when high-frequency noises are injected, clear differences appear between the countermeasure proposal and the present first modified example with respect to the eye pattern. That is, it can be seen that the reception waveform (FIG. 30A) corresponding to the connection structure of the countermeasure proposal is equivalent to the reception waveform (FIG. 29B) when high-frequency noises are not added to the eye pattern in the reception waveform (FIG. 30B) corresponding to the connection structure of the present first modified example, while the eye pattern is collapsed in the reception waveform (FIG. 30A) corresponding to the connection structure of the countermeasure proposal. That is, when the connecting structures of the present first modified example are employed, it is understood that the received waveforms are not substantially affected by high-frequency noises.

Figure 31A:
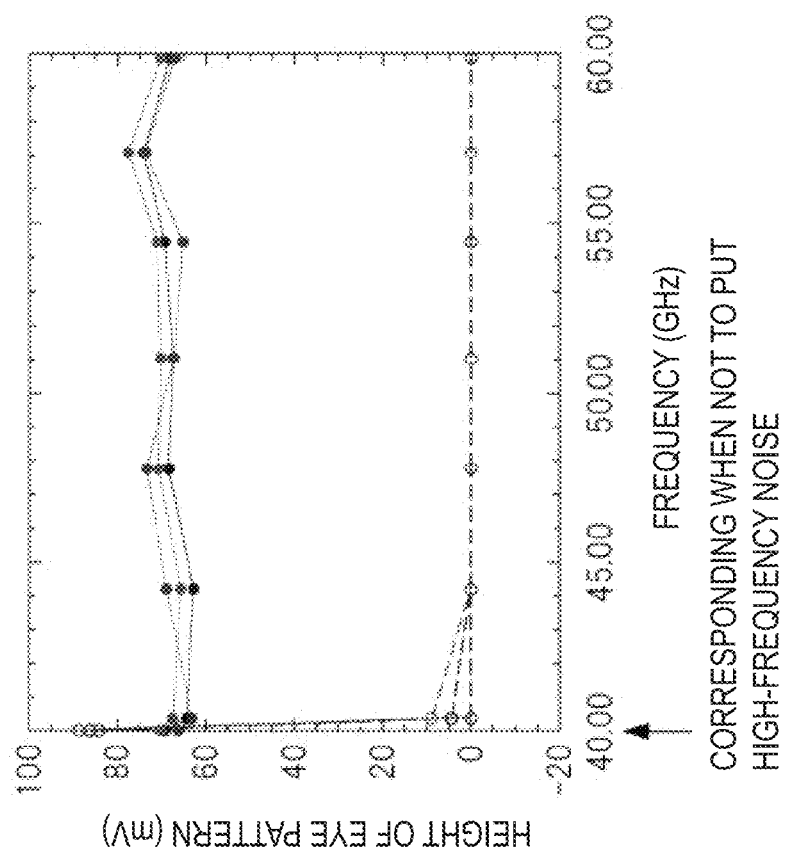
FIG. 31A is a graph showing the frequency dependence of the height of the eye pattern.
Figure 31B:
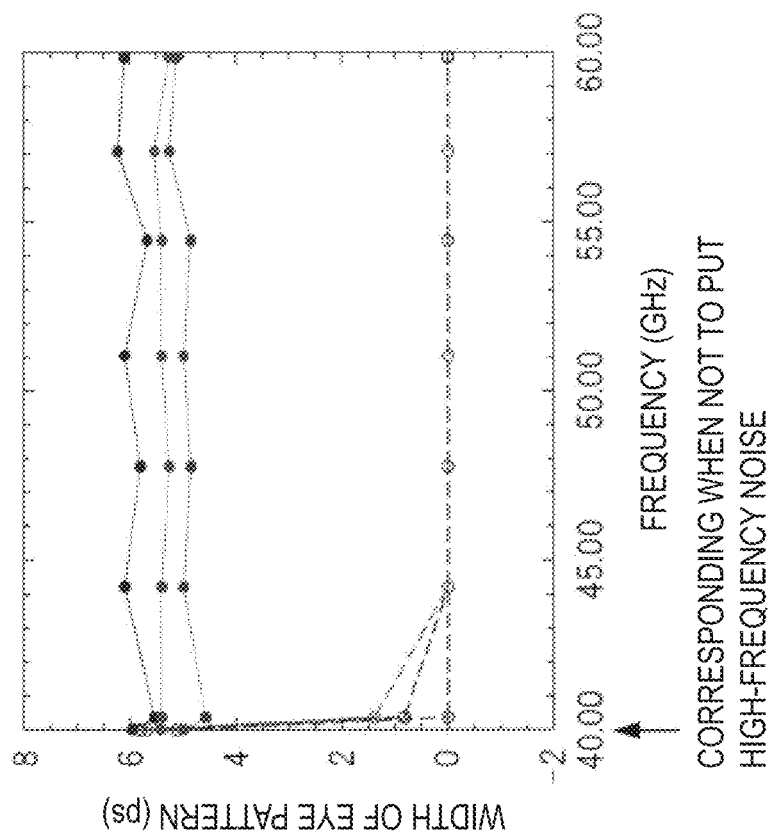
FIG. 31B is a graph showing the frequency dependence of the width of the eye pattern.

Next, FIGS. 31A and 31B are a graph showing the frequency dependence of the height and width of the eye pattern in the case where the insertion loss is 1 dB or less and the pad pitch is 1.0 mm in the case where the insertion loss is about 1.5 times the Nyquist frequency of the high-frequency signal.

In particular, FIG. 31A is a graph showing the frequency dependence of the height of the eye pattern, and FIG. 31B is a graph showing the frequency dependence of the width of the eye pattern.

First, in FIG. 31A and FIG. 31B, the dotted line is a graph corresponding to the connection structure of the countermeasure proposal, and the solid line is a graph corresponding to the connection structure of the present first modified example.

As shown in FIG. 31A and FIG. 31B, when high-frequency noises are injected, the eye pattern is completely closed in the countermeasure plan shown by the dotted line, whereas the eye pattern is not much changed in the present first modified example shown by the solid line. In other words, this first modified example is less susceptible to high-frequency noise and is highly resistant to high-frequency noise.

Figure 32A:
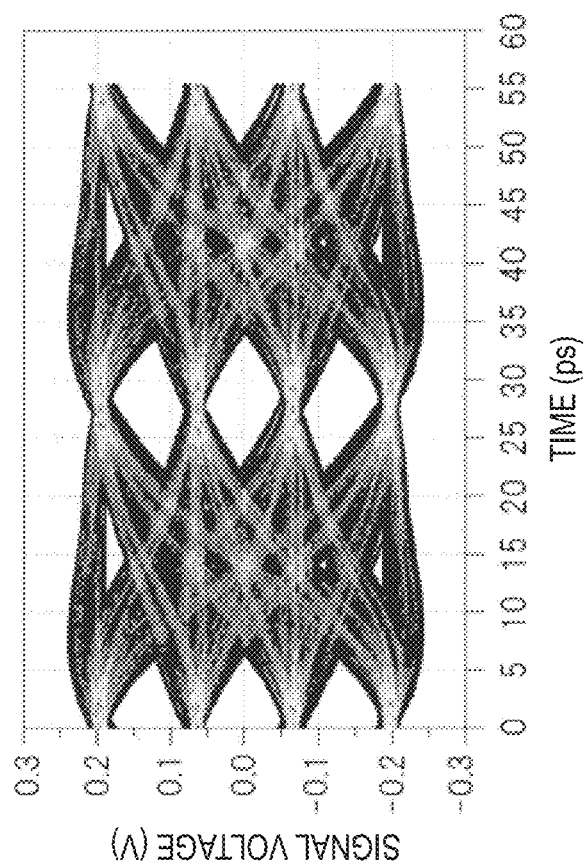
FIG. 32A shows the eye pattern in the countermeasure plan when there is no high-frequency noise.
Figure 32B:
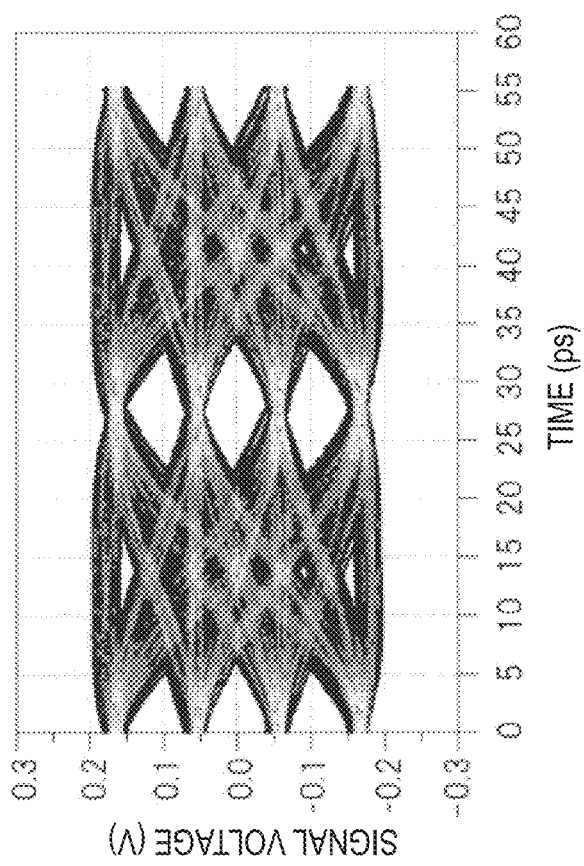
FIG. 32B shows the eye pattern in first modified example when there is no high-frequency noise.
Figure 33A:
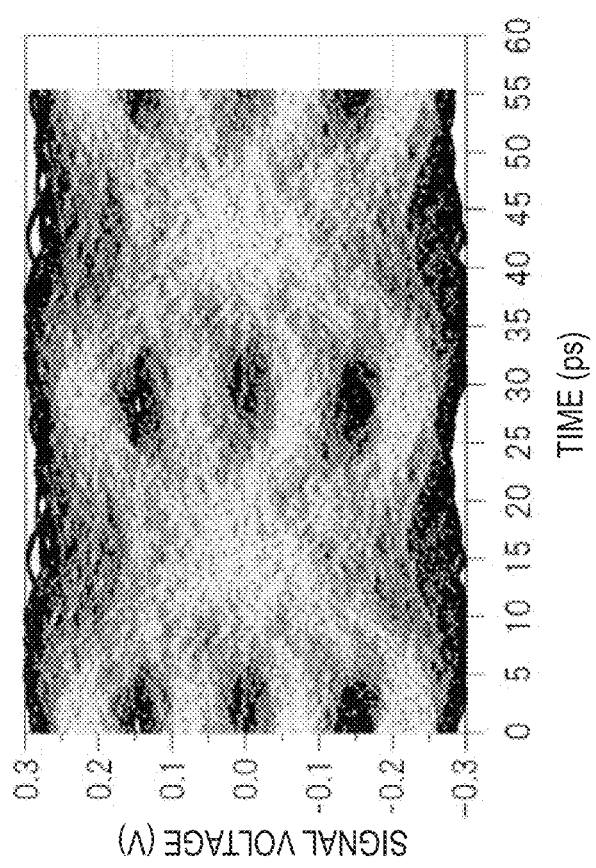
FIG. 33A shows the eye pattern in the countermeasure plan when there is high-frequency noise.

Specifically, FIG. 32A is a diagram showing the eye pattern in the countermeasure proposal when there is no high-frequency noise, and FIG. 32B is a diagram showing the eye pattern in the present first modified example when there is no high-frequency noise. On the other hand, FIG. 33A is a diagram showing the eye pattern in the countermeasure proposal when there is high-frequency noise, and FIG. 33B is a diagram showing the eye pattern in the present first modified example when there is high-frequency noise.

As shown in FIG. 32A and FIG. 32B, the reception waveforms when no high-frequency noises are added are substantially the same in the countermeasure proposal and the present first modified example, but it is understood that the eye pattern of the present first modified example is slightly smaller than the eye pattern of the countermeasure proposal. However, as shown in FIG. 33A and FIG. 33B, when high-frequency noises are injected, this relationship is reversed, and further, it can be seen that clear differences appear between the countermeasure proposal and the present first modified example with respect to the eye pattern. That is, it can be seen that the reception waveform (FIG. 33A) corresponding to the connection structure of the countermeasure proposal completely collapses the eye pattern, whereas the reception waveform (FIG. 33B) corresponding to the connection structure of the present first modified example is equivalent to the reception waveform (FIG. 32B) when the high-frequency noises are not added to the eye pattern. That is, when the connecting structures of the present first modified example are employed, the received waveforms are substantially not affected by high-frequency noises.

Figure 33B:
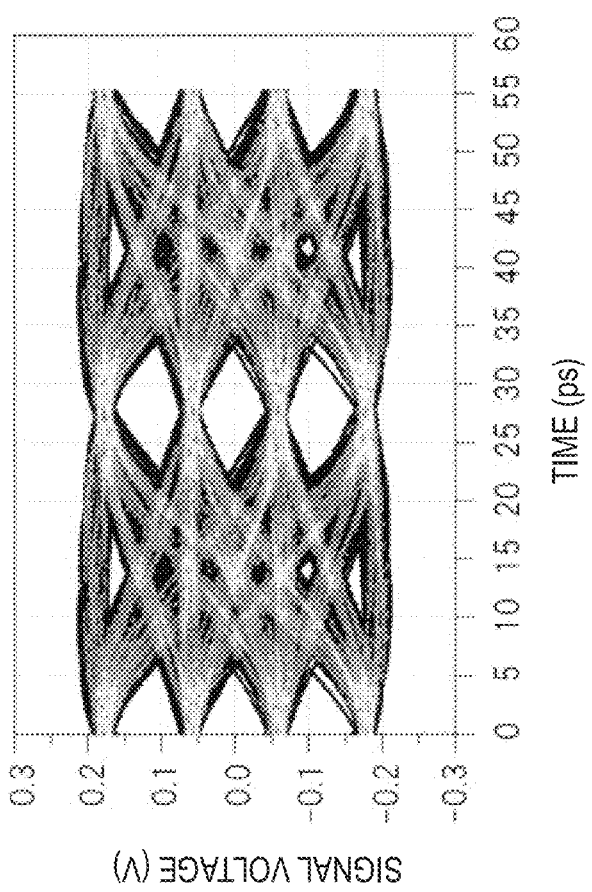
FIG. 33B shows the eye pattern in first modified example when there is high-frequency noise.
Figure 34A:
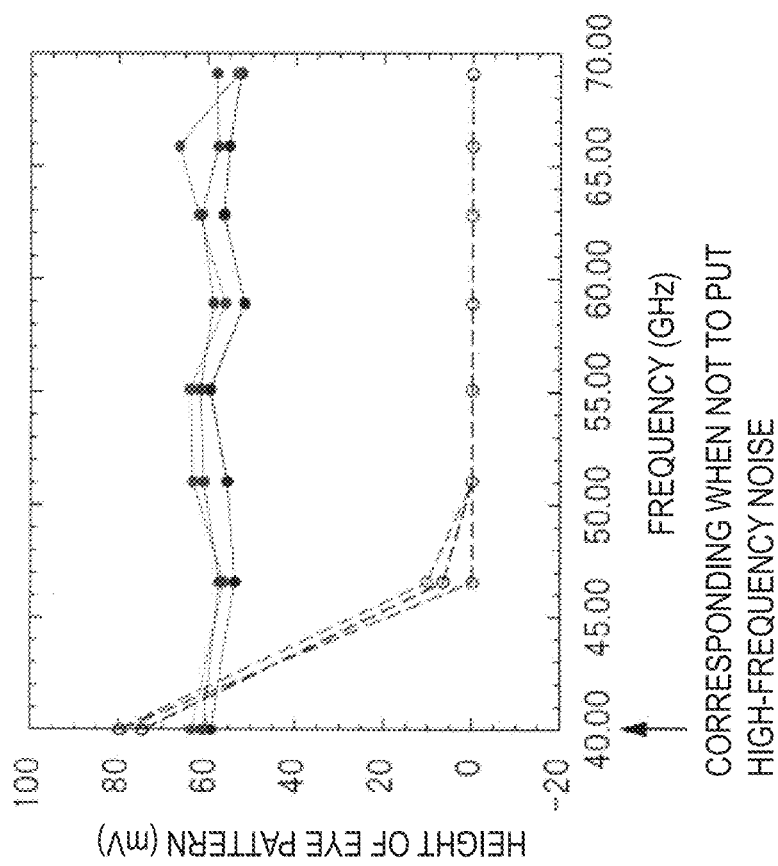
FIG. 34A is a graph showing the frequency dependence of the height of the eye pattern.

Next, FIGS. 34A and 33B are a graph showing the frequency dependence of the height and width of the eye pattern in the case where the insertion loss is 1 dB or less and the pad pitch is 0.8 mm in the case where the band is about 1.5 times the Nyquist frequency of the high-frequency signal.

Figure 34B:
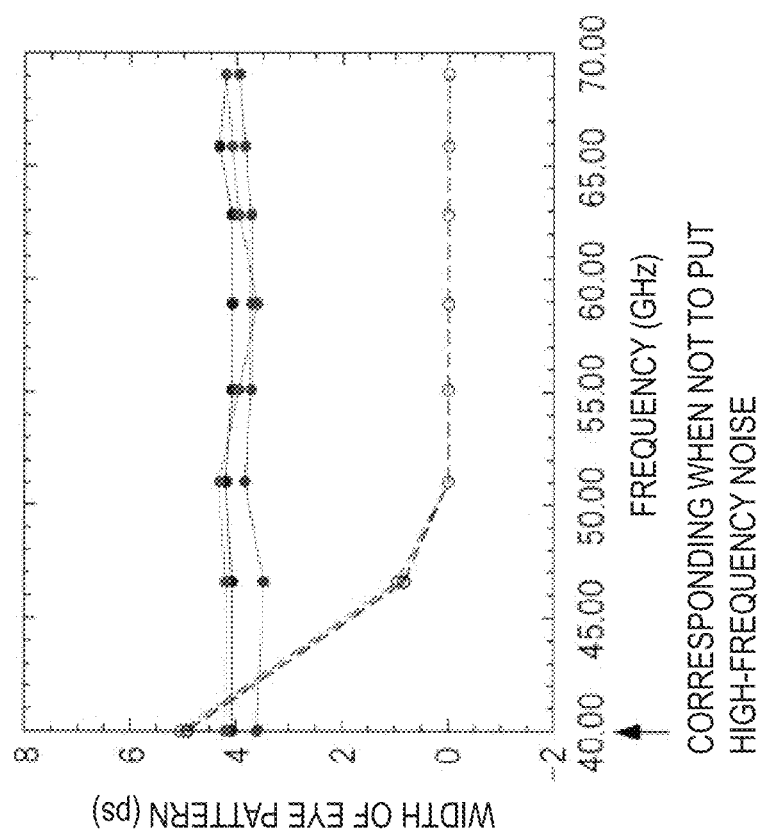
FIG. 34B is a graph showing the frequency dependence of the width of the eye pattern.

In particular, FIG. 34A is a graph showing the frequency dependence of the height of the eye pattern, and FIG. 34B is a graph showing the frequency dependence of the width of the eye pattern.

First, in FIG. 34A and FIG. 34B, the dotted line is a graph corresponding to the connection structure of the countermeasure proposal, and the solid line is a graph corresponding to the connection structure of the present first modified example.

As shown in FIG. 34A and FIG. 34B, when high-frequency noises are injected, the eye pattern is completely closed in the countermeasure plan shown by the dotted line, whereas the eye pattern is not much changed in the present first modified example shown by the solid line. In other words, this first modified example is less susceptible to high-frequency noise and is highly resistant to high-frequency noise.

Figure 35A:
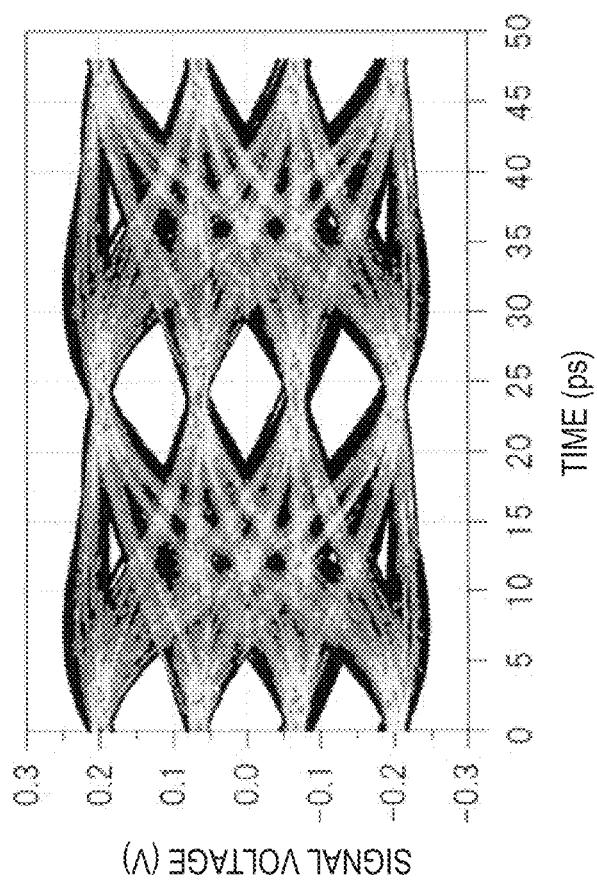
FIG. 35A shows the eye pattern in the countermeasure plan when there is no high-frequency noise.
Figure 35B:
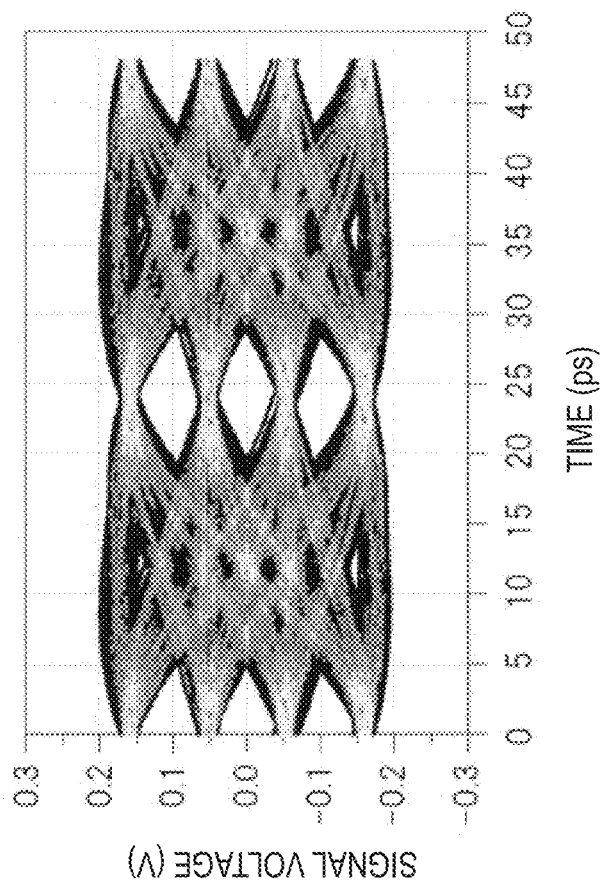
FIG. 35B shows the eye pattern in first modified example when there is no high-frequency noise.
Figure 36A:
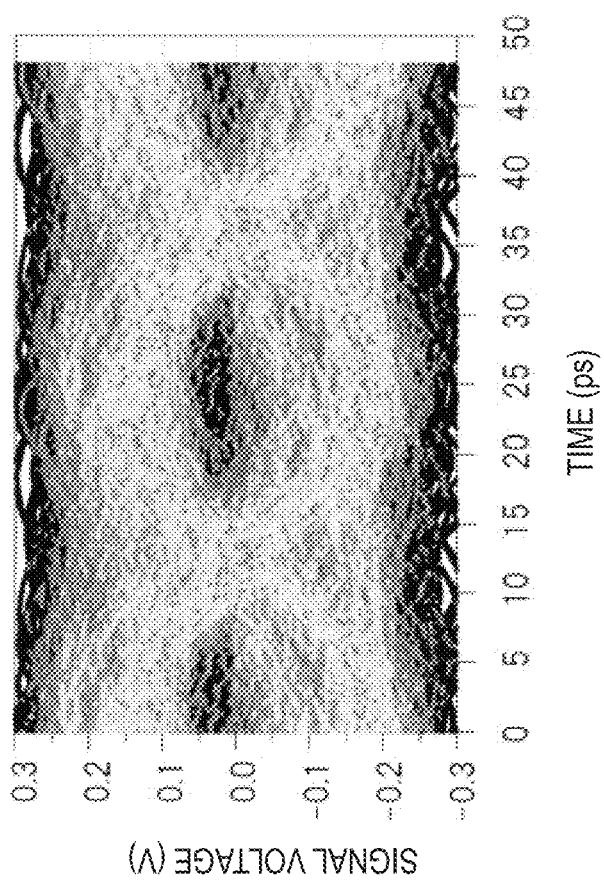
FIG. 36A shows the eye pattern in the countermeasure plan when there is high-frequency noise.
Figure 36B:
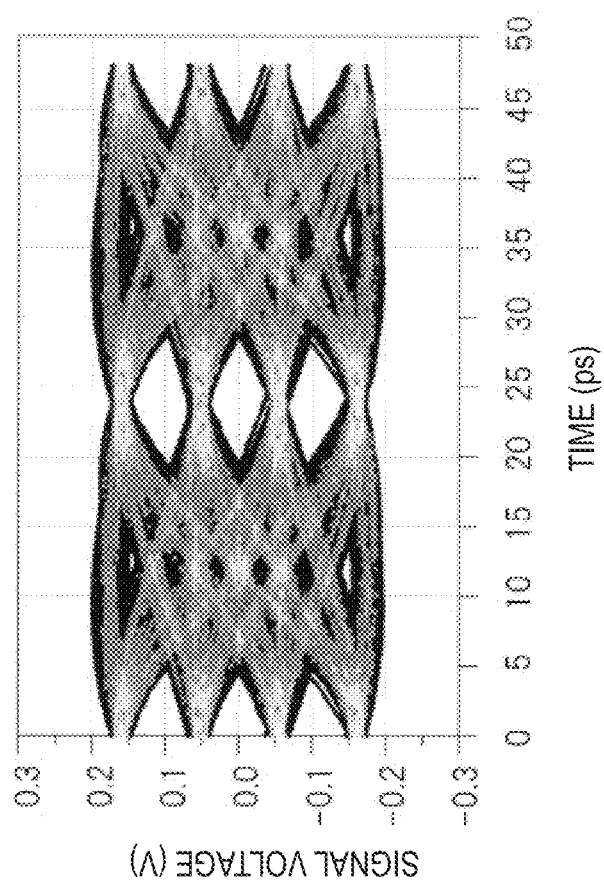
FIG. 36B shows the eye pattern in first modified example when there is high-frequency noise.

Specifically, FIG. 35A is a diagram showing the eye pattern in the countermeasure plan in the case where there is no high-frequency noise, and FIG. 35B is a diagram showing the eye pattern in the present first modified example in the case where there is no high-frequency noise. On the other hand, FIG. 36A is a diagram showing the eye pattern in the countermeasure proposal when there is high-frequency noise, and FIG. 36B is a diagram showing the eye pattern in the present first modified example when there is high-frequency noise.

As shown in FIG. 35A and FIG. 35B, the reception waveforms when no high-frequency noises are added are substantially the same in the countermeasure proposal and the present first modified example, but it is understood that the eye pattern of the present first modified example is slightly smaller than the eye pattern of the countermeasure proposal. However, as shown in FIG. 36A and FIG. 36B, when high-frequency noises are injected, this relationship is reversed, and moreover, clear differences appear between the countermeasure proposal and the present first modified example with respect to the eye patterns. That is, it can be seen that the reception waveform (FIG. 36A) corresponding to the connection structure of the countermeasure proposal completely collapses the eye pattern, whereas the reception waveform (FIG. 36B) corresponding to the connection structure of the present first modified example is equivalent to the reception waveform (FIG. 35B) when high-frequency noises are not added. That is, when the connecting structures of the present first modified example are employed, the received waveforms are substantially not affected by high-frequency noises.

As described above, according to the present first modified example, it is possible to make the received waveforms less susceptible to high-frequency noises. In other words, according to the present first modified example, it is possible to increase the immunity to high-frequency noises.

Modified Example 2

In the embodiment, the electromagnetic wave absorption pattern for absorbing the scattered electromagnetic wave is not provided above the pad, but the electromagnetic wave absorption pattern for absorbing the scattered electromagnetic wave may be provided above the pad. That is, since the basic idea of the embodiment is to intentionally limit the signal transmission band, the configuration of providing the electromagnetic wave absorption pattern is not indispensable, but if the configuration of providing the electromagnetic wave absorption pattern above the pad is adopted, the frequency response in the vicinity of the impedance pole can be easily controlled. By providing the electromagnetic wave absorption pattern, it is possible to absorb the reflected wave, thereby making the impedance pole broader. That is, the fact that the impedance pole can be made broader means that the frequency dependence of the insertion loss can be flattened in the frequency band on the low frequency side of the impedance pole, thereby improving the signal transmission characteristic in the frequency band on the low frequency side of the impedance pole.

The electromagnetic wave absorption pattern can be composed of, for example, a mesh pattern.

Modified Example 3

Figure 37:
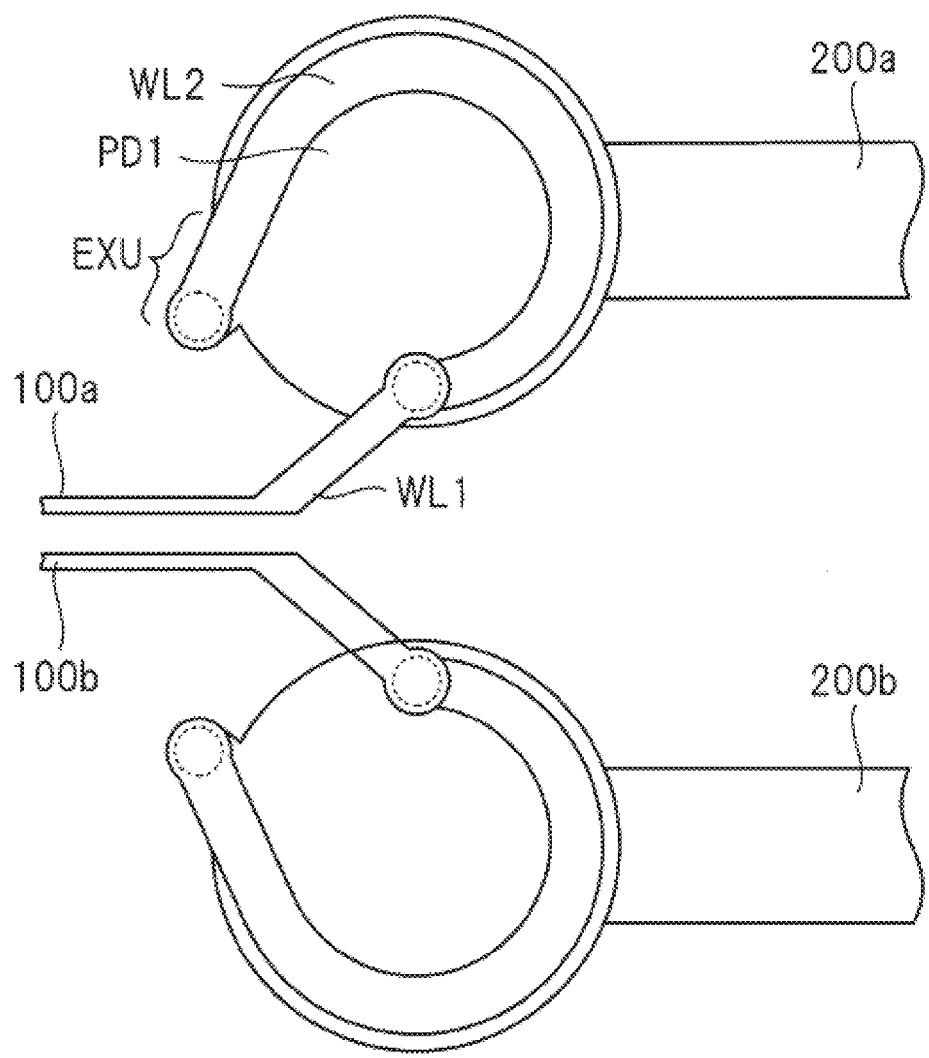
FIG. 37 is a schematic diagram showing the connecting structures in the third modified example.

FIG. 37 is a schematic diagram showing a connecting configuration in the present third modified example.

As shown in FIG. 37, a via portion between the interconnect WL2 and the pad PD1 constituting the high-impedance portion may be provided at a position not overlapping with the pad PD1 in plan view. If the length of the wiring WL2 is maintained, the electric length (phase) decreases, and therefore, for example, as shown in FIG. 37, the extension portion EXU needs to be provided in the wiring WL2 in order to increase the parasitic inductance.

Modified Example 4

Figure 38:
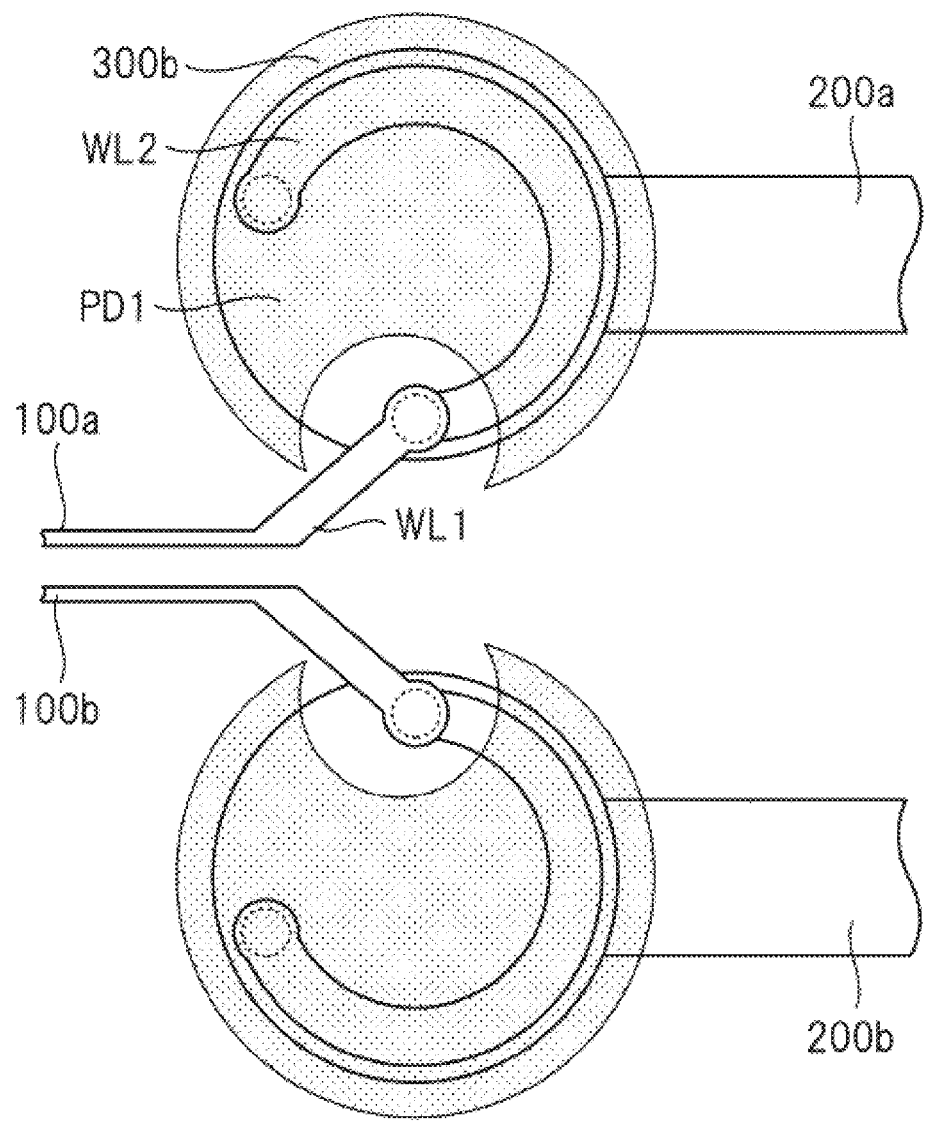
FIG. 38 is a schematic diagram showing the connecting structures in the fourth modified example.

FIG. 38 is a schematic diagram showing a connecting configuration in the present fourth modified example.

Figure 39:
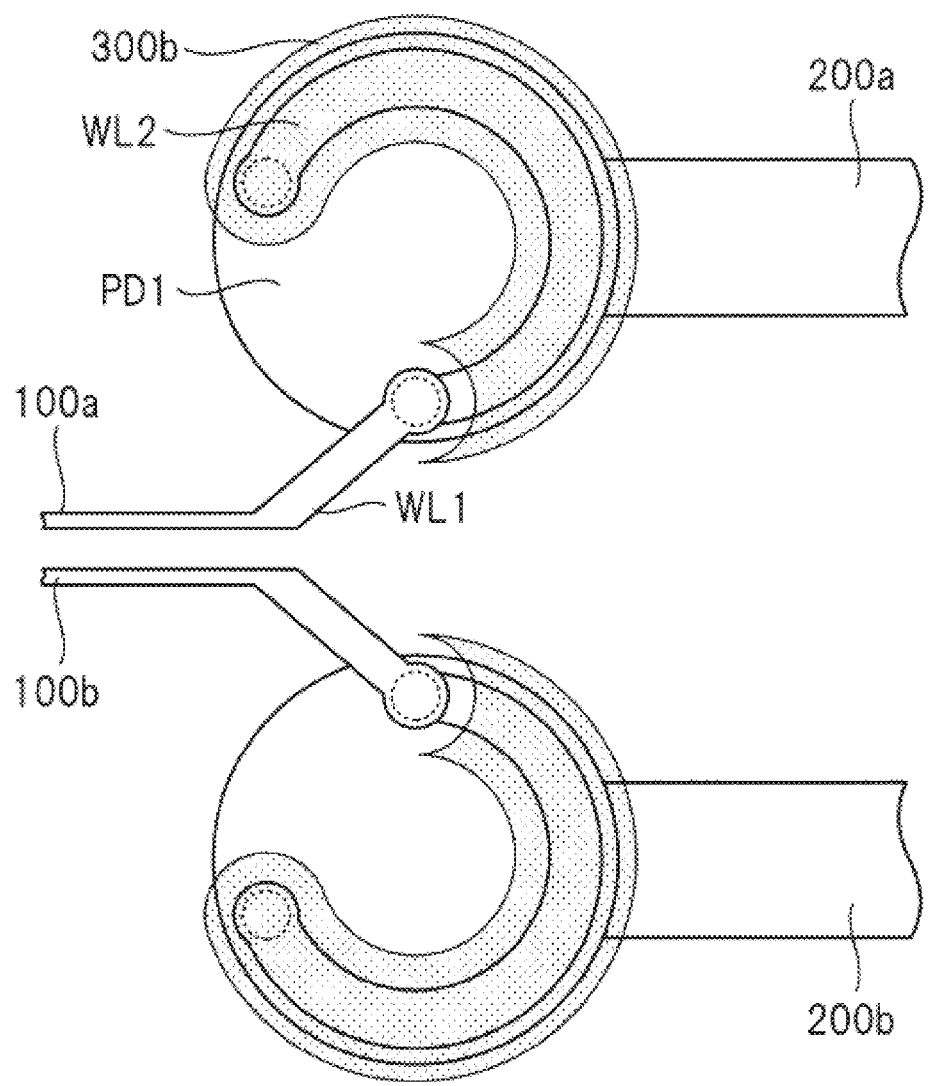
FIG. 39 is a schematic diagram showing the connecting structures in the fourth modified example.

As shown in FIG. 38, a ground pattern 300a that covers the pad PD1 in a planar manner may be provided above the pad PD1. Since the parasitic capacitances can be increased, the degree of flexibility in designing the high-impedance delay section (interconnection WL2) can be improved. However, the ground pattern provided above the pads PD1 does not have to be shaped like the ground pattern 300a, and for example, as shown in FIG. 39, the ground pattern 300b may be formed of a wide pattern covering the interconnection WL2 constituting the high-impedance portion. In this instance, both the parasitic capacitances and the parasitic inductances of the interconnection WL2 constituting the high-impedance delay section can be precisely adjusted.

Modified Example 5

In the embodiment, the basic idea in the embodiment has been described by taking a design for 56 Gbps per PAM4 transmission as an example, but the basic idea in the embodiment can also be applied to a design for transmission in a higher frequency band (112 Gbps per PAM4), for example.

Figure 40:
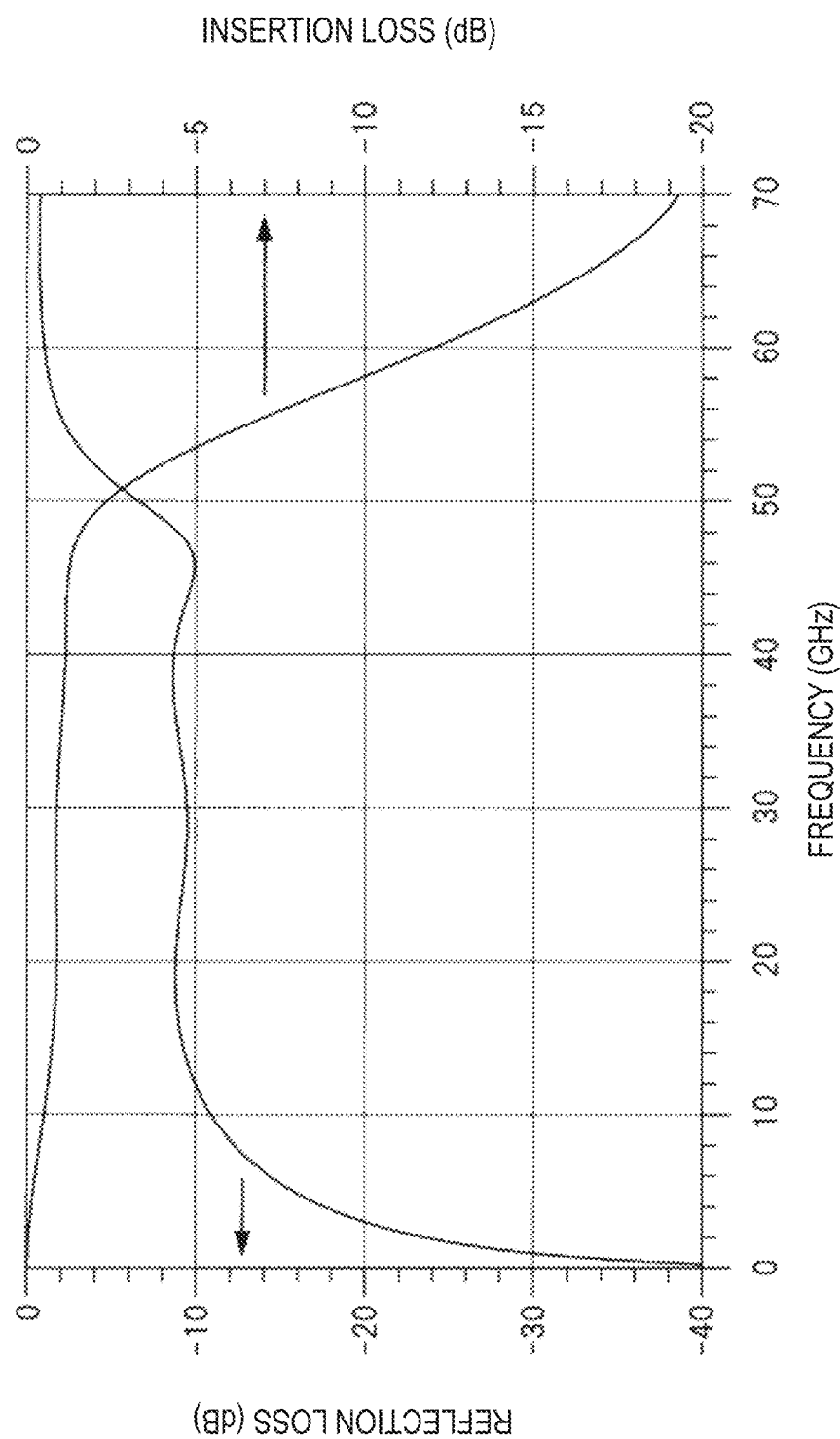
FIG. 40 is a graph showing the frequency dependence of reflection loss and insertion loss.
Figure 41:
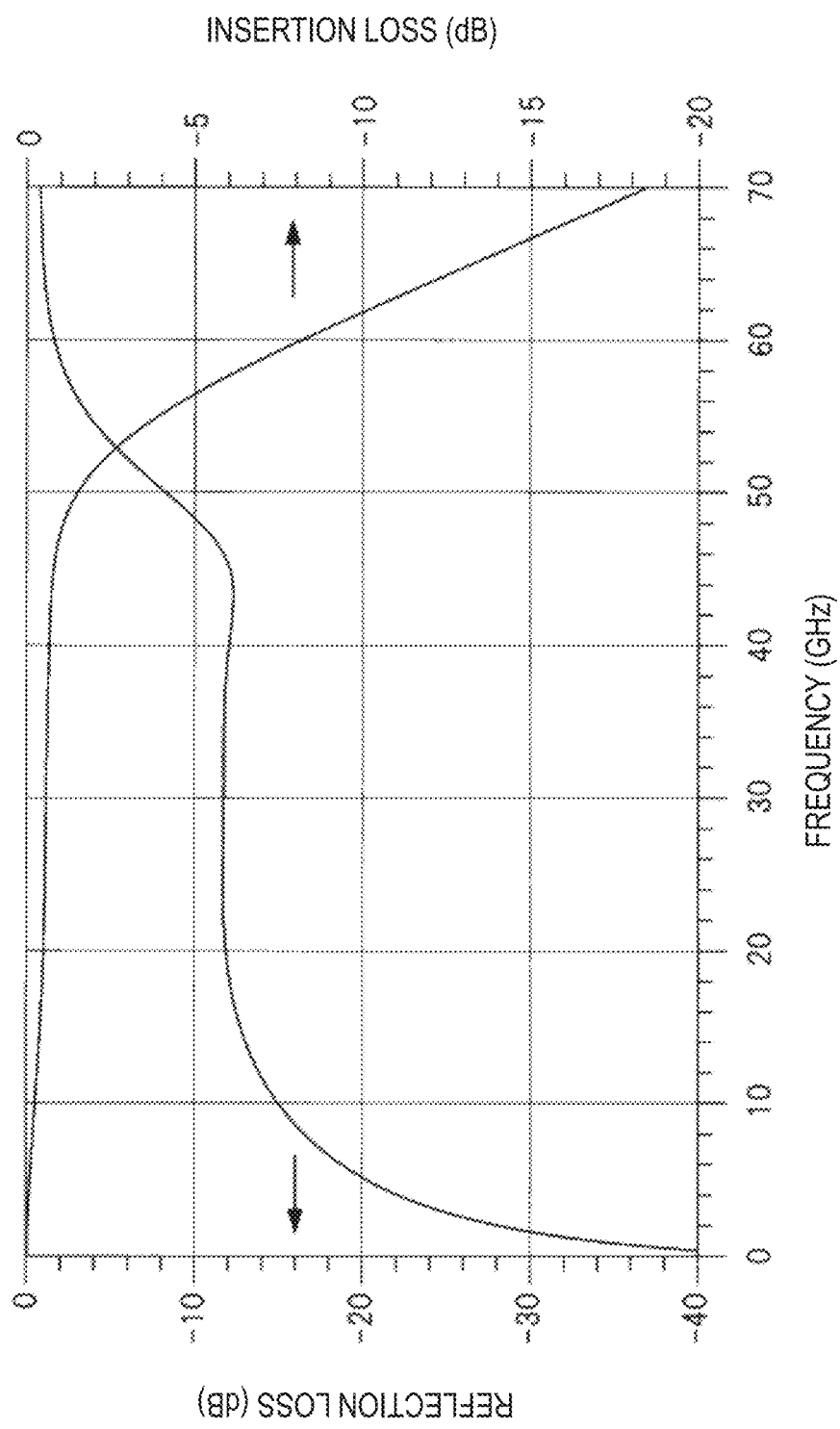
FIG. 41 is a graph showing the frequency dependence of reflection loss and insertion loss.

Specifically, FIG. 40 is a graph showing the frequency dependence of the reflection loss and the frequency dependence of the insertion loss in a transmission design example (pad pitch: 1 mm) of 112 Gbps per PAM4. FIG. 41 is a graph showing the frequency dependence of the reflection loss and the frequency dependence of the insertion loss in a transmission design example (pad pitch: 0.8 mm) of 112 Gbps per PAM4.

As shown in FIGS. 40 and 41, by adopting the basic idea of the embodiment, it is possible to design a band-limiting filter capable of passing a signal lower than 50 GHz well, while blocking a high-frequency noise higher than 50 GHz.

The invention made by the present inventor has been described above in detail based on the embodiment, but the present invention is not limited to the embodiment described above, and it is needless to say that various modifications can be made without departing from the gist thereof.

The embodiment includes the following modes.

(Appendix 1) (Basic Concept)

A semiconductor device comprising:

a first wiring; and an impedance change portion connected with the first wiring, wherein the impedance change portion has:

a high impedance delay portion having a characteristics impedance higher than a characteristics impedance of the first wiring; and a low impedance delay portion having a characteristics impedance lower than a characteristics impedance of the first wiring, wherein, in the frequency dependence of a reflection loss between the first wiring and the impedance change portion, there is an impedance pole indicating a frequency at which the reflection loss is minimized, and wherein a characteristics impedance of the impedance change portion seen from the first wiring is sifted from the characteristics impedance of the first wiring.

(Appendix 2)

The semiconductor device according to the appendix 1, wherein the impedance change portion is served as a band-limiting filter.

(Appendix 3)

The semiconductor device according to the appendix 1, wherein the high impedance delay portion has a second wiring, and wherein the impedance pole is formed by adjusting each of a length of the second wiring and a width of the second wiring.

(Appendix 4) (Basic Concept)

An electronic device comprising:

a mother board; and a semiconductor device mounted on the mother board, wherein the mother board has a transmission line electrically connected with the semiconductor device, wherein the semiconductor device has an impedance change portion, wherein the impedance change portion has:

a high impedance delay portion having a characteristics impedance higher than a characteristics impedance of the transmission line; and a low impedance delay portion having a characteristics impedance lower than a characteristics impedance of the transmission line, wherein, in the frequency dependence of a reflection loss between the transmission line and the impedance change portion, there is an impedance pole indicating a frequency at which the reflection loss is minimized, and wherein a characteristics impedance of the impedance change portion seen from the transmission line is sifted from the characteristics impedance of the transmission line.

(Appendix 5)

The electronic device according to the appendix 4, wherein the impedance change portion is served as a band-limiting filter.

(Appendix 6)

The electronic device according to the appendix 4, wherein the high impedance delay portion has a wiring, and wherein the impedance pole is formed by adjusting each of a length of the wiring and a width of the wiring.

What is claimed is:

1. A semiconductor device comprising:
   a wiring substrate having a front surface and a back surface,
   wherein the wiring substrate has:
     a pad formed on the back surface;
     an external connection terminal connected to the pad, and located below the pad;
     a first wiring electrically connected with the pad, and located above the pad; and
     a second wiring electrically connected with the first wiring,
   wherein the first wiring has 1) a first length that is parallel to the back surface of the wiring substrate 2) a first width that is parallel to the back surface of the wiring substrate and 3) a first height that is perpendicular to the back surface of the wiring substrate,
   wherein the first width is shorter than the first length,
   wherein the second wiring has 1) a second length that is parallel to the back surface of the wiring substrate 2) a second width that is parallel to the back surface of the wiring substrate and 3) a second height that is perpendicular to the back surface of the wiring substrate,
   wherein the second width is shorter than the second length, and
   wherein the first width of the first wiring is greater than the second width of the second wiring.

2. The semiconductor device according to claim 1,
   wherein the wiring substrate has a multi wiring structure,
   wherein the pad is formed in a first wiring layer,
   wherein the first wiring is formed in a second wiring layer located one layer above than the first wiring layer,
   wherein the second wiring is formed in a third wiring layer located one layer above than the second wiring layer,
   wherein the pad and the first wiring are connected with each other by way of a first via portion, and
   wherein the first wiring and the second wiring are connected with each other by way of a second via portion.

3. The semiconductor device according to claim 1,
   wherein the wiring substrate has a multi wiring structure,
   wherein the pad is formed in a first wiring layer,
   wherein the first wiring is formed in a third wiring layer located two layers above than the first wiring layer,
   wherein the second wiring is formed in a fourth wiring layer located one layer above than the third wiring layer,
   wherein the pad and the first wiring are connected with each other by way of:
     a relay wiring formed in a second wiring layer that is located one layer above than the first wiring layer, and that is located one layer below than the third wiring layer,
     a first via portion connected the pad with the relay wiring, and
     a second via portion connected the relay wiring with the first wiring, and
   wherein the first wiring and the second wiring are connected with each other by way of a third via portion.

4. The semiconductor device according to claim 1,
   wherein the second wiring has:
     a narrow portion having a first width; and
     a wide portion having a second width greater than the first width, and
   wherein the wide portion is situated between the narrow portion and the first wiring.

5. The semiconductor device according to claim 4, wherein the wide portion has a portion that increases in width from the narrow portion toward the first wiring.

6. The semiconductor device according to claim 1, wherein the first wiring has a portion overlapping with the pad in a plan view.

7. The semiconductor device according to claim 6,
   wherein a planar shape of the pad is a circular shape, and
   wherein, in the plan view, the first wiring is extended along an edge of the pad.

8. The semiconductor device according to claim 7,
   wherein the pad and the first wiring are connected with each other by way of a first via portion,
   wherein the first wiring and the second wiring are connected with each other by way of a second via portion,
   wherein the first wiring has 1) a first end portion that is in contact with the first via portion and 2) a second end portion that is in contact with the second via portion,
   wherein the first wiring extends for an arc length of an angle of 180 degrees or more about a center point of the pad,
   wherein the first length of the first wiring is equivalent to the arc length, and
   wherein the angle is an angle formed between 1) a first virtual line that connects the center point of the pad and the first end portion of the first wiring and 2) a second virtual line that connects the center point of the pad and the second end portion of the first wiring.

9. The semiconductor device according to claim 8, wherein the angle formed by the first virtual line and the second virtual line is 220 degrees or more, and 340 degrees or less.

10. The semiconductor device according to claim 1, wherein an electromagnetic wave absorption pattern is situated above the first wiring.

11. The semiconductor device according to claim 10, wherein the electromagnetic wave absorption pattern is formed in mesh shape.

12. The semiconductor device according to claim 1,
wherein each of the first wiring and the second wiring is a wiring for signal, and
wherein the pad is a pad for signal.

13. The semiconductor device according to claim 12, wherein the wiring for signal is a wiring for transmitting a four-valued signal.

14. The semiconductor device according to claim 1, wherein a ground pattern is situated above the first wiring.

15. The semiconductor device according to claim 14, wherein the first wiring has a portion overlapping with the ground pattern in a plan view.

* * * * *